US006456218B1

United States Patent
Dedic et al.

(12) United States Patent
(10) Patent No.: US 6,456,218 B1
(45) Date of Patent: Sep. 24, 2002

(54) NOISE SHAPING IN SEGMENTED MIXED-SIGNAL CIRCUITRY

(75) Inventors: Ian Juso Dedic, Northolt; Sanjay Ashwin-Kumar Umedbhai Patel, Reading, both of (GB)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/708,677

(22) Filed: Nov. 9, 2000

(30) Foreign Application Priority Data

Nov. 10, 1999 (GB) .............................. 9926650
Jan. 28, 2000 (GB) .............................. 0002049

(51) Int. Cl.[7] .............................. H03M 1/66
(52) U.S. Cl. ............... 341/144; 341/144; 341/150; 341/153
(58) Field of Search ............... 341/144, 150, 341/153

(56) References Cited

U.S. PATENT DOCUMENTS

| | | | | |
|---|---|---|---|---|
| 4,395,714 A | * | 7/1983 | Takeda et al. | 341/150 |
| 4,791,406 A | | 12/1988 | Mehrgardt et al. | 341/144 |
| 4,935,741 A | | 6/1990 | Reich | 341/150 |
| 5,404,142 A | * | 4/1995 | Adams et al. | 341/144 |
| 5,539,405 A | * | 7/1996 | Norsworthy | 341/144 |
| 5,844,515 A | * | 12/1998 | Park | 341/118 |
| 5,856,799 A | * | 1/1999 | Hamasaki et al. | |
| 5,995,031 A | | 11/1999 | Okuda et al. | 341/144 |
| 6,124,813 A | * | 9/2000 | Robertson et al. | 341/143 |

FOREIGN PATENT DOCUMENTS

GB 2 333 190 7/1999

OTHER PUBLICATIONS

Steensgaard, Jesper, "Structural Optimization and Scaling of SC Delta–Sigma ADCs", *Lecture Notes for Delta–Sigma Data Converters*, Mar. 16–19, 1999, San Diego, California.

Galton, Ian, "Mismatch–Shaping Multibit DECs for Delta–Sigma ADCs and DACs", *Lecture Notes for Delta–Sigma Data Converters*, Mar. 16–19, 1999, San Diego, California.

Adams, Bob, "Unconventional Applications of Noise–Shaping Techniques", *Lecture Notes for Delta–Sigma Data Converters*, Mar. 16–19, 1999, San Diego, California.

* cited by examiner

Primary Examiner—Michael Tokar
Assistant Examiner—Linh Van Nguyen
(74) Attorney, Agent, or Firm—Staas & Halsey, LLP

(57) ABSTRACT

Mixed-signal circuitry (20), comprising digital circuitry and analog circuitry, is operative to perform a series of operation cycles. The analog circuitry has a plurality of circuitry segments (2, 4) which together produce an output signal having a frequency in a predetermined desired range of frequencies. The digital circuitry comprises a digital signal generating portion (6) operable in each cycle to generate a set of digital signals (T1–Tn) for application to respective ones of said segments, and a segment rotation section (22) operable to rotate by r segments the digital signals (T1–Tn) applied to the segments in each cycle as compared to those applied in the preceding cycle, where r is a rotation amount for the cycle concerned. The digital circuitry further comprises a rotation control section (24) for setting the rotation amount r for each cycle such that one or more rotation components, being frequency components present in a frequency spectrum of the output signal as a result of the rotation, are mapped to one or more preselected frequencies or preselected narrow bands of frequencies outside the predetermined desired range.

42 Claims, 22 Drawing Sheets

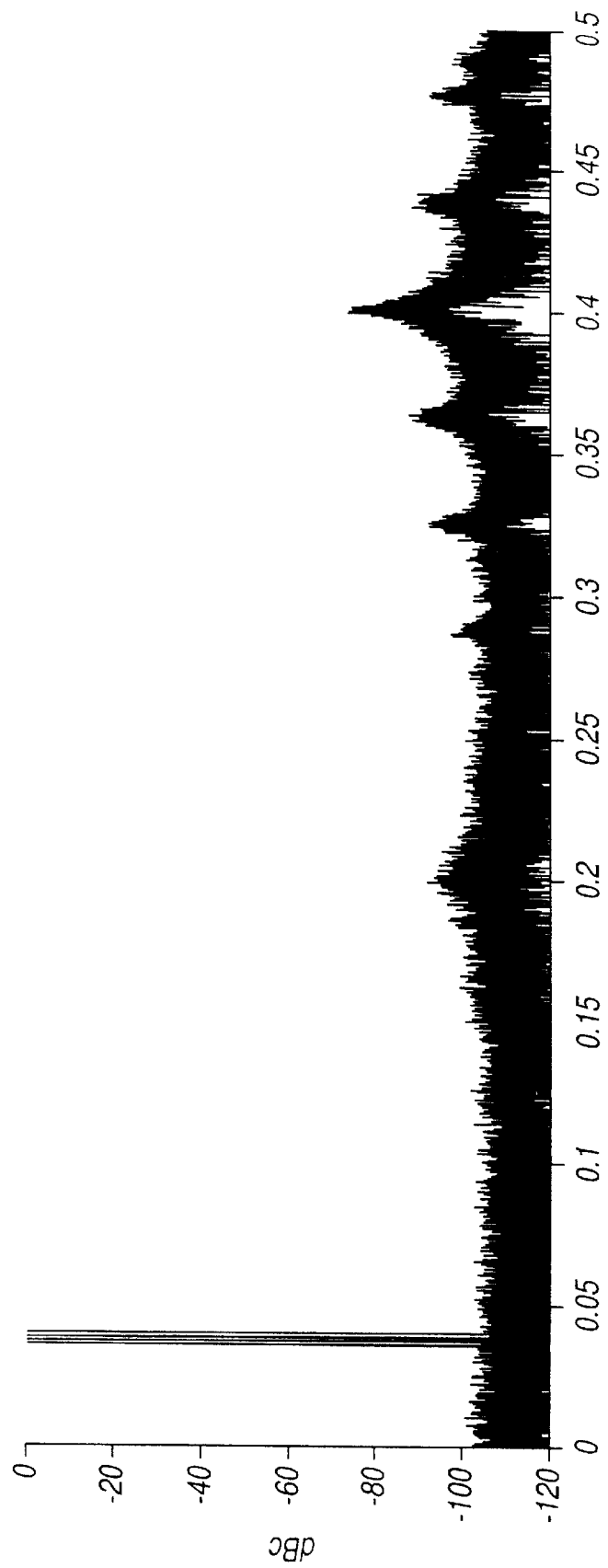

| NUM/DEN (1) | r (2) | $F_{upper}$ (3) | Rotation Components (4) | BASEBAND 0-48.5MHz SNR | | PASSBAND 13.5-48.5MHz SNR | | Increase: Baseband vs Passband (9) | Baseband Mean-2σ (10) | Passband Mean-2σ (11) |
|---|---|---|---|---|---|---|---|---|---|---|
| | | | | Mean (5) | σ (6) | Mean (7) | σ (8) | | | |
| 1/3 | 42.67 | 277.5 | 1/3, 1/3 | 104.7 | 4.96 | 119.0 | 2.75 | 14.3 | 94.8 | 113.4 |
| 1/4 | 32.00 | 208.0 | 1/4, 1/2, 1/4 | 115.3 | 3.25 | 121.0 | 2.36 | 5.7 | 108.8 | 116.3 |
| 1/5 | 25.60 | 167.0 | 1/5, 2/5, 2/5, 1/5 | 112.8 | 4.20 | 122.1 | 2.17 | 9.3 | 104.3 | 117.8 |
| 2/5 | 51.20 | 167.0 | 2/5, 1/5, 1/5, 2/5 | 112.6 | 4.26 | 121.4 | 1.98 | 8.8 | 104.1 | 117.4 |
| 2/7 | 35.67 | 118.8 | 2/7, 3/7, 1/7, 1/7 | 118.4 | 3.14 | 123.5 | 1.63 | 5.1 | 112.1 | 120.2 |
| 3/7 | 54.86 | 118.8 | 3/7, 1/7, 2/7, 2/7, 1/7 | 117.9 | 3.40 | 122.4 | 1.85 | 4.5 | 111.1 | 118.7 |
| 3/8 | 48.00 | 104.0 | 3/8, 2/8, 1/8, 4/8, 1/8 | 121.1 | 2.39 | 123.0 | 1.81 | 1.9 | 116.3 | 119.4 |
| 2/9 | 28.44 | 92.4 | 2/9, 4/9, 3/9, 1/9, 1/9 | 120.9 | 2.19 | 122.5 | 1.89 | 1.6 | 116.5 | 118.7 |
| 3/10 | 38.40 | 83.2 | 3/10, 4/10, 1/10, 2/10, 5/10 | 121.3 | 2.41 | 121.8 | 2.60 | 0.5 | 116.4 | 116.6 |
| 2/11 | 23.27 | 75.6 | 2/11, 4/11, 5/11, 3/11, 1/11 | 122.2 | 1.67 | 122.6 | 1.64 | 0.4 | 118.8 | 119.3 |
| 3/11 | 34.91 | 75.6 | 3/11, 5/11, 2/11, 1/11, 4/11 | 122.4 | 1.88 | 122.9 | 1.79 | 0.5 | 118.6 | 119.3 |
| 4/11 | 46.55 | 75.6 | 4/11, 3/11, 1/11, 5/11, 2/11 | 121.4 | 2.41 | 121.8 | 2.54 | 0.4 | 116.5 | 116.7 |
| 5/12 | 53.33 | 69.3 | 5/12, 2/12, 3/12, 4/12, 1/12 | 122.1 | 1.47 | 122.5 | 1.45 | 0.4 | 119.2 | 119.6 |
| 3/13 | 29.54 | 64.0 | 3/13, 6/13, 4/13, 1/13, 2/13 | 122.7 | 1.78 | 123.1 | 1.81 | 0.4 | 119.1 | 119.5 |
| 4/13 | 39.38 | 64.0 | 4/13, 5/13, 1/13, 3/13, 7/13 | 121.6 | 2.70 | 121.7 | 2.81 | 0.1 | 116.1 | 116.1 |
| 5/13 | 49.23 | 64.0 | 5/13, 3/13, 2/13, 6/13, 1/13 | 122.7 | 1.48 | 123.2 | 1.40 | 0.5 | 119.7 | 120.4 |
| 3/14 | 27.43 | 59.4 | 3/14, 6/14, 5/14, 2/14, 1/14 | 123.0 | 1.66 | 123.2 | 1.66 | 0.2 | 119.7 | 119.9 |
| 5/14 | 45.21 | 59.4 | 5/14, 4/14, 1/14, 6/14, 3/14 | 121.0 | 3.00 | 121.1 | 3.04 | 0.1 | 115.0 | 115.0 |
| 4/15 | 34.13 | 55.5 | 4/15, 7/15, 3/15, 1/15, 5/15 | 121.8 | 2.11 | 122.0 | 2.04 | 0.2 | 117.6 | 118.0 |
| NONE (RANDOM) | | | | 114.4 | 3.2 | 114.4 | 3.2 | | 108.0 | 108.0 |

*Fig. 15*

NOISE SHAPING IN SEGMENTED MIXED-SIGNAL CIRCUITRY

BACKGROUND OF THE INVENTION

1. Field of the Invention

The present invention relates to noise shaping in segmented mixed-signal circuitry such as, for example, digital-to-analog converters.

2. Description of the Related Art

FIG. 1 of the accompanying drawings shows parts of a conventional digital-to-analog converter (DAC) of the so-called "current-steering" type. The DAC 1 is designed to convert an m-bit digital input word (D1–Dm) into a corresponding analog output signal.

The DAC 1 includes a plurality (n) of identical current sources $2_1$ to $2_n$, where $n=2^m-1$. Each current source 2 passes a substantially constant current I. The DAC 1 further includes a plurality of differential switching circuits $4_1$ to $4_n$ corresponding respectively to the n current sources $2_1$ to $2_n$. Each differential switching circuit 4 is connected to its corresponding current source 2 and switches the current I produced by the current source either to a first terminal, connected to a first connection line A of the converter, or a second terminal connected to a second connection line B of the converter.

Each differential switching circuit 4 receives one of a plurality of control signals T1 to Tn (called "thermometer-coded signals" for reasons explained hereinafter) and selects either its first terminal or its second terminal in accordance with the value of the signal concerned. A first output current $I_A$ of the DAC 1 is the sum of the respective currents delivered to the differential-switching-circuit first terminals, and a second output current $I_B$ of the DAC 1 is the sum of the respective currents delivered to the differential-switching-circuit second terminals.

The analog output signal is the voltage difference $V_A$-$V_B$ between a voltage $V_A$ produced by sinking the first output current $I_A$ of the DAC 1 into a resistance R and a voltage $V_B$ produced by sinking the second output current $I_B$ of the converter into another resistance R.

In the FIG. 1 DAC the thermometer-coded signals T1 to Tn are derived from the binary input word D1–Dm by a binary-thermometer decoder 6. The decoder 6 operates as follows.

When the binary input word D1–Dm has the lowest value the thermometer-coded signals T1–Tn are such that each of the differential switching circuits $4_1$ to $4_n$ selects its second terminal so that all of the current sources $2_1$ to $2_n$ are connected to the second connection line B. In this state, $V_A=0$ and $V_B=nIR$. The analog output signal $V_A$-$V_B$=-nIR.

As the binary input word D1–Dm increases progressively in value, the thermometer-coded signals T1 to Tn produced by the decoder 6 are such that more of the differential switching circuits select their respective first terminals (starting from the differential switching circuit 41) without any differential switching circuit that has already selected its first terminal switching back to its second terminal. When the binary input word D1–Dm has the value i, the first i differential switching circuits $4_1$ to $4_i$ select their respective first terminals, whereas the remaining n-i differential switching circuits $4_{i+1}$ to $4_n$ select their respective second terminals. The analog output signal $V_A$-$V_B$ is equal to (2i-n)IR.

FIG. 2 shows an example of the thermometer-coded signals generated for a three-bit binary input word D1–D3 (i.e. in this example m=3). In this case, seven thermometer-coded signals T1 to T7 are required ($n=2^m-1=7$).

As FIG. 2 shows, the thermometer-coded signals T1 to Tn generated by the binary-thermometer decoder 6 follow a so-called thermometer code in which it is known that when an rth-order signal Tr is activated (set to "1"), all of the lower-order signals T1 to Tr–1 will also be activated.

Thermometer coding is popular in DACs of the current-steering type because, as the binary input word increases, more current sources are switched to the first connection line A without any current source that is already switched to that line A being switched to the other line B. Accordingly, the input/output characteristic of the DAC is monotonic and the glitch impulse resulting from a change of 1 in the input word is small.

It will be appreciated that the number of current sources 2 and corresponding differential switching circuits 4 in the FIG. 1 architecture is quite large, particularly when m is greater than or equal to 6. When m=6, for example, n=63, and 63 current sources and 63 differential switching circuits are required. In order to deal with such a large number of current sources, and to enable the thermometer signals to be delivered efficiently to the different differential switching circuits, it has been proposed to arrange the current sources and differential switching circuits as a two-dimensional array of cells, each cell including one current source and its associated differential switching circuit. This arrangement is shown in FIG. 3.

In FIG. 3, 64 cells $CL_{ij}$ are arranged in an 8×8 square array having eight rows and eight columns. In FIG. 3, the first digit of the suffix applied to each cell denotes the row in which the cell is located and the second digit of the suffix denotes the column in which the cell is located. Thus, the cell $CL_{18}$ is the cell in row 1, column 8.

Each cell $CL_{ij}$ includes its own current source 2 and its own differential switching circuit 4. The respective first terminals of the cells of the array are connected together to a first connection line A of the DAC and the respective second terminals of the cells of the array are connected together to a second connection line B of the DAC, as in the FIG. 1 DAC.

The numbers allotted to the cells $CL_{ij}$ in FIG. 3 denote the sequence in which the cells are activated (or controlled) to change from selecting their respective second terminals to selecting their respective first terminals. The activation sequence follows the physical order of the cells in the array, starting from row 1 and activating the cells of that row sequentially in column order, followed by row 2, and so on for each successive row of the array.

One problem which arises in the FIG. 3 arrangement is that, although the output currents of the respective current sources 2 of the different cells of the array should be uniform, in practice the actual output currents of the cells suffer from non-uniformity arising from various causes.

For example, a voltage drop along a power supply line can cause a graded error along a row or column, as shown in FIG. 4(A). In this case, the current sources in the first four cells of the row or column concerned may have negative errors, signifying that each of them produces a below-average output current. These negative errors decrease towards the centre of the row or column concerned. The current sources in the remaining cells 5 to 8 of the row or column concerned have respective positive errors, signifying that each of them produces an above-average output current. These positive errors increase from the centre of the row or column to the end.

Thermal distribution inside a chip including the array can cause a symmetrical error within a row or column, as shown in FIG. 4(B). In this case, the current sources in the end cells 1, 2, 7 and 8 of the row or column have negative errors, whereas the current sources of the central cells 3 to 6 of the row or column have positive errors.

In addition, there can be other types of error such as random errors. The final error distribution for the cell array is produced by superposing all the different error components.

The graded and symmetrical errors shown in FIGS. 4(A) and FIG. 4(B) tend to accumulate and result in a large integral linearity error (INL). For example, imagine that the graded error distribution shown in FIG. 4(A) exists within the first row of the cell array shown in FIG. 3. In this case, as cells 1 to 4 are progressively activated (changed from selecting their respective second terminals to selecting their respective first terminals) the negative errors accumulate, amounting to a significant total negative error when the digital input code is 4. Only when cells 5 to 8 are sequentially activated do the positive errors attributable to these cells start to cancel out the large negative error attributable to cells 1 to 4.

Of course the situation is even worse if there are graded errors corresponding to FIG. 4(A) along each of the columns 1 to 8. In this case, as cells 1 to 8 are progressively activated, the largest negative error (the error at position 1 in FIG. 4(A)) occurs for each of the eight cells of row 1. Similarly, in row 2, negative errors corresponding to position 2 in FIG. 4(A) accumulate eight times. Thus, by the time the input code has increased to 32 (corresponding to all of the cells in rows 1 to 4 being activated) the accumulated negative error is very large indeed.

Similar problems arise with the accumulation of symmetrical errors of the kind shown in FIG. 4(B).

Mismatches due to graded and symmetrical errors can be reduced by selecting the cells in a special sequence different from the sequence in which they are arranged physically in the cell array. In particular, a special cell selection sequence conforming to the sequence of numbers in a so-called "magic square" is described in the applicant's United States patent U.S. Pat. No. 6,100,830 (corresponding to United Kingdom patent publication no. GB-A-2333190), the entire content of which is hereby incorporated by reference.

However, even when such a special cell selection sequence is employed, there inevitably remains a mismatch between the respective currents produced by the different segments. This in turn causes non-linearity in the performance of the DAC.

It has been proposed in a paper entitled "Structural Optimization and Scaling of SC Delta-Sigma AADCs", Jesper Steensgaard, Delta-Sigma Data Converters Lecture Course, Mar. 16–19 1999, San Diego, Calif., to employ element (or segment) rotation to shape mismatches between the elements of a DAC. In this proposal, the elements are rotated using data-directed rotation amounts. Another paper from the same lecture course, entitled "Mismatch-Shaping Multibit DACs for Delta-Sigma ADCs and DACs, Ian Galton, discloses mismatch shaping techniques which move noise from low frequencies to high frequencies to improve the noise shape. In these techniques the noise increases rapidly with frequency at high output-signal frequencies, so large oversampling ratios (e.g. 8 or 25) must be used to obtain useful results. A further paper from the same lecture course, entitled "Unconventional Applications of Noise-Shaping Techniques", Bob Adams, discloses that element "scrambling" can be employed in a sigma-delta DAC to turn distortion into shaped noise. The scrambling can be either random, which distributes the noise evenly across the entire frequency spectrum both within and outside the desired range of frequencies of the output signal, or data-directed which moves the noise away from DC but has noise that increases in amplitude progressively with frequency.

SUMMARY OF THE INVENTION

According to a first aspect of the present invention there is provided mixed-signal circuitry, comprising digital circuitry and analog circuitry, operative to perform a series of operation cycles, wherein: said analog circuitry has a plurality of circuitry segments which together produce an output signal having a frequency in a predetermined desired range of frequencies; and the digital circuitry comprises: digital signal generating circuitry operable in each said cycle to generate a set of digital signals for application to respective ones of said segments; rotating circuitry operable to rotate by r segments the digital signals applied to the segments in each cycle as compared to those applied in the preceding cycle, where r is a rotation amount for the cycle concerned; and rotation control circuitry which sets said rotation amount r for each said cycle such that one or more rotation components, being frequency components present in a frequency spectrum of said output signal as a result of said rotation, are mapped to one or more preselected frequencies or preselected narrow bands of frequencies outside said predetermined desired range.

According to a second aspect of the present invention there is provided digital-to-analog conversion circuitry comprising digital circuitry and analog circuitry, and operative to perform a series of operation cycles, wherein: said analog circuitry has a plurality of circuitry segments which together produce an output signal having a frequency in a predetermined desired range of frequencies; and the digital circuitry comprises: digital signal generating circuitry operable in each said cycle to generate a set of digital signals for application to respective ones of said segments; rotating circuitry operable to rotate by r segments the digital signals applied to the segments in each cycle as compared to those applied in the preceding cycle, where r is a rotation amount for the cycle concerned; and rotation control circuitry which sets said rotation amount r for each said cycle such that one or more rotation components, being frequency components present in a frequency spectrum of said output signal as a result of said rotation, are mapped to one or more preselected frequencies or preselected narrow bands of frequencies outside said predetermined desired range.

According to a third aspect of the present invention there is provided a noise shaping method, for use in mixed-signal circuitry that comprises digital circuitry and analog circuitry and is operative to perform a series of operation cycles, the analog circuitry having a plurality of circuitry segments which together produce an output signal having a frequency in a predetermined desired range of frequencies, which method comprises: generating in each said cycle a set of digital signals for application to respective ones of said segments; rotating by r segments the digital signals applied to the segments in each cycle as compared to those applied in the preceding cycle, where r is a rotation amount for the cycle concerned; and setting said rotation amount for each said cycle such that one or more rotation components, being frequency components present in a frequency spectrum of said output signal as a result of said rotation, are mapped to one or more preselected frequencies or preselected narrow bands of frequencies outside said predetermined desired range.

According to a fourth aspect of the present invention there is provided a method of selecting a rotation amount r to be used by mixed-signal circuitry that is operative to perform a series of operation cycles and that comprises: analog circuitry having a plurality of circuitry segments which together produce an output signal having a frequency in a predetermined desired range of frequencies; and digital circuitry which in each said cycle generates a set of digital signals for application to respective ones of said segments, the digital signals applied to the segments in each cycle being rotated by r segments as compared to those applied in the preceding cycle, such that one or more rotation components, being frequency components present in a frequency spectrum of said output signal as a result of said rotation, are mapped to one or more preselected frequencies or preselected narrow bands of frequencies outside said predetermined desired range; said method comprising: plotting a graph having a first axis representing frequency and a second axis, perpendicular to said first axis, representing said rotation amount r; for each of a plurality of preselected lower-order rotation components, representing using a corresponding first line in the graph the different frequencies to which that component is mapped as said rotation amount r is varied; representing one or more frequencies in said desired range of frequencies of the output signal using one or more corresponding second lines in the graph extending in the second-axis-direction at appropriate positions along the first axis; identifying regions in said graph containing portions of said second lines that are not intersected by any of said first lines; and selecting said rotation amount r to be used by said mixed-signal circuitry from amongst the range of rotation amounts r corresponding to such an identified region.

According to a fifth aspect of the present invention there is provided a method of selecting a rotation amount r to be used by mixed-signal circuitry that is operative to perform a series of operation cycles and that comprises: analog circuitry having a plurality of circuitry segments which together produce an output signal having a frequency in a predetermined desired range of frequencies; and digital circuitry which in each said cycle generates a set of digital signals for application to respective ones of said segments, the digital signals applied to the segments in each cycle being rotated by r segments as compared to those applied in the preceding cycle, such that one or more rotation components, being frequency components present in a frequency spectrum of said output signal as a result of said rotation, are mapped to one or more preselected frequencies or preselected narrow bands of frequencies outside said predetermined desired range; said method comprising: plotting a graph having a first axis representing frequency and a second axis, perpendicular to said first axis, representing said rotation amount r; for each of a plurality of preselected significant intermodulation sidebands, representing using a corresponding said first set of lines in said graph the different frequencies to which that sideband is mapped as said rotation amount is varied; representing one or more frequencies in said desired range of frequencies of the output signal using one or more corresponding second lines in said graph extending in the second-axis-direction at appropriate positions along said first axis; identifying regions in said graph containing portions of said second lines that are not intersected by any first-set lines; and selecting said rotation amount to be used by said mixed-signal circuitry from amongst the range of rotation amounts r corresponding to such an identified region.

According to a sixth aspect of the present invention there is provided a method of selecting a rotation amount r to be used by mixed-signal circuitry that is operative to perform a series of operation cycles and that comprises: analog circuitry having a plurality of circuitry segments which together produce an output signal having a frequency in a predetermined desired range of frequencies; and digital circuitry which in each said cycle generates a set of digital signals for application to respective ones of said segments, the digital signals applied to the segments in each cycle being rotated by r segments as compared to those applied in the preceding cycle, such that one or more rotation components, being frequency components present in a frequency spectrum of said output signal as a result of said rotation, are mapped to one or more preselected frequencies or preselected narrow bands of frequencies outside said predetermined desired range; said method comprising: plotting a first graph having a first axis representing frequency and a second axis, perpendicular to said first axis, representing said rotation amount r; for each of a plurality of preselected lower-order rotation components, representing using a corresponding first line in said first graph the different frequencies to which that component is mapped as said rotation amount r is varied; representing one or more frequencies in said desired range of frequencies of the output signal using one or more corresponding second lines in said first graph extending in the second-axis-direction thereof at appropriate positions along said first axis thereof; identifying regions in said first graph containing portions of said second lines that are not intersected by any of said first lines; plotting a second graph having a first axis representing frequency and a second axis, perpendicular to said first axis, representing said rotation amount r; for each of a plurality of preselected significant intermodulation sidebands, representing using a corresponding first set of lines in said second graph the different frequencies to which that sideband is mapped as said rotation amount r is varied; representing one or more frequencies in said desired range of frequencies of the output signal using one or more corresponding second lines extending in said second graph in the second-axis-direction thereof at appropriate positions along said first axis thereof; identifying regions in said second graph containing portions of said second lines that are not intersected by any first-set lines; and selecting said rotation amount r to be used by said mixed-signal circuitry from amongst the range of rotation amounts r corresponding to such an identified region in one of said first and second graphs.

According to a seventh aspect of the present invention there is provided a computer-readable recording medium storing a computer program having code portions which carry out a method of selecting a rotation amount r to be used by mixed-signal circuitry that is operative to perform a series of operation cycles and that comprises: analog circuitry having a plurality of circuitry segments which together produce an output signal having a frequency in a predetermined desired range of frequencies; and digital circuitry which in each said cycle generates a set of digital signals for application to respective ones of said segments, the digital signals applied to the segments in each cycle being rotated by r segments as compared to those applied in the preceding cycle, such that one or more rotation components, being frequency components present in a frequency spectrum of said output signal as a result of said rotation, are mapped to one or more preselected frequencies or preselected narrow bands of frequencies outside said predetermined desired range; said program comprising: a plotting code portion which plots a graph having a first axis representing frequency and a second axis, perpendicular to said first axis, representing said rotation amount r; a rotation component representing code portion which, for each of a plurality of preselected lower-order rotation components, represents using a corresponding first line in the graph the different frequencies to which that component is mapped as said rotation amount r is varied; an output signal representing code portion which represents one or more frequencies in said desired range of frequencies of the output signal using one or more corresponding second lines in the graph extending in the second-axis-direction at appropriate positions along the first axis; thereby to facilitate identification of regions in said graph containing portions of said second lines that are not intersected by any of said first lines, and selection of said rotation amount r to be used by said mixed-signal circuitry from amongst the range of rotation amounts r corresponding to such an identified region.

According to an eighth aspect of the present invention there is provided a computer-readable recording medium storing a computer program having code portions which carry out a method of selecting a rotation amount r to be used by mixed-signal circuitry that is operative to perform a series of operation cycles and that comprises: analog circuitry having a plurality of circuitry segments which together produce an output signal having a frequency in a predetermined desired range of frequencies; and digital circuitry which in each said cycle generates a set of digital signals for application to respective ones of said segments, the digital signals applied to the segments in each cycle being rotated by r segments as compared to those applied in the preceding cycle, such that one or more rotation components, being frequency components present in a frequency spectrum of said output signal as a result of said rotation, are mapped to one or more preselected frequencies or preselected narrow bands of frequencies outside said predetermined desired range; said program comprising: a plotting code portion which plots a graph having a first axis representing frequency and a second axis, perpendicular to said first axis, representing said rotation amount r; a rotation component representing code portion which, for each of a plurality of preselected significant intermodulation sidebands, represents using a corresponding said first set of lines in said graph the different frequencies to which that sideband is mapped as said rotation amount is varied; an output signal representing code portion which represents one or more frequencies in said desired range of frequencies of the output signal using one or more corresponding second lines in said graph extending in the second-axis-direction at appropriate positions along said first axis; identifying regions in said graph containing portions of said second lines that are not intersected by any first-set lines; and selecting said rotation amount to be used by said mixed-signal circuitry from amongst the range of rotation amounts r corresponding to such an identified region.

According to a ninth aspect of the present invention there is provided a computer-readable recording medium storing a computer program having code portions which carry out a method of selecting a rotation amount r to be used by mixed-signal circuitry that is operative to perform a series of operation cycles and that comprises: analog circuitry having a plurality of circuitry segments which together produce an output signal having a frequency in a predetermined desired range of frequencies; and digital circuitry which in each said cycle generates a set of digital signals for application to respective ones of said segments, the digital signals applied to the segments in each cycle being rotated by r segments as compared to those applied in the preceding cycle, such that one or more rotation components, being frequency components present in a frequency spectrum of said output signal as a result of said rotation, are mapped to one or more preselected frequencies or preselected narrow bands of frequencies outside said predetermined desired range; said program comprising: a first plotting code portion which plots a first graph having a first axis representing frequency and a second axis, perpendicular to said first axis, representing said rotation amount r; a rotation component representing portion which, for each of a plurality of preselected lower-order rotation components, represents using a corresponding first line in said first graph the different frequencies to which that component is mapped as said rotation amount r is varied; a first output signal representing code portion which represents one or more frequencies in said desired range of frequencies of the output signal using one or more corresponding second lines in said first graph extending in the second-axis-direction thereof at appropriate positions along said first axis thereof; a second plotting code portion which plots a second graph having a first axis representing frequency and a second axis, perpendicular to said first axis, representing said rotation amount r; an intermodulation sideband representing code portion which, for each of a plurality of preselected significant intermodulation sidebands, represents using a corresponding first set of lines in said second graph the different frequencies to which that sideband is mapped as said rotation amount r is varied; a second output signal representing code portion which represents one or more frequencies in said desired range of frequencies of the output signal using one or more corresponding second lines extending in said second graph in the second-axis- direction thereof at appropriate positions along said first axis thereof; thereby to facilitate identification of regions in said first graph containing portions of said second lines that are not intersected by any of said first lines, identification of regions in said second graph containing portions of said second lines that are not intersected by any first-set lines, and selection of said rotation amount r to be used by said mixed-signal circuitry from amongst the range of rotation amounts r corresponding to such an identified region in one of said first and second graphs.

The program may be carried on or by a carrier. The carrier may be a storage medium (e.g. disk or CD ROM) or a signal (e.g. downloaded from Internet).

According to a tenth aspect of the present invention there is provided digital signal generating circuitry, for generating a rotating set of digital signals in successive operation cycles in dependence upon a control signal, specifying a number of said digital signals in said set which are to have a predetermined state, and a rotation amount r, specifying a number of digital signals by which said set in a current one of said cycles is rotated relative to said set in the preceding cycle, said circuitry comprising: a plurality of signal generating circuits, each having a circuit ID assigned uniquely to it, and each being operable in each said cycle to produce a rotated ID signal which is dependent on said assigned circuit ID and which differs by said rotation amount r from the rotated ID signal in the preceding cycle, and to set said digital signal for its signal generating circuit into said predetermined state in dependence upon a comparison of the rotated ID signal and said control signal; each said signal generating circuit being provided with a first circuit portion operable to produce a first part of the rotated ID signal and to compare that part of the rotated ID signal with a first part of said control signal, and with a second circuit portion operable to produce a second part of said rotated ID signal and to compare that part with a second part of said control signal, wherein said second circuit portion produces the second part of the rotated ID signal whilst said first circuit portion compares the first part of the rotated ID signal with the first part of the control signal. One such first circuit portion can be provided in common for a group of said segments whose respective said rotated-ID-signal first parts are the same and whose respective data-signal first parts are the same.

BRIEF DESCRIPTION OF THE DRAWINGS

FIG. 8(A) shows an output-signal frequency spectrum in another embodiment of the present invention;

FIG. 15 is a table relating to the first example and to a fourth example in which the output-signal frequency range is in a baseband.

DETAILED DESCRIPTION OF THE PREFERRED EMBODIMENTS

Figures 1, 2:
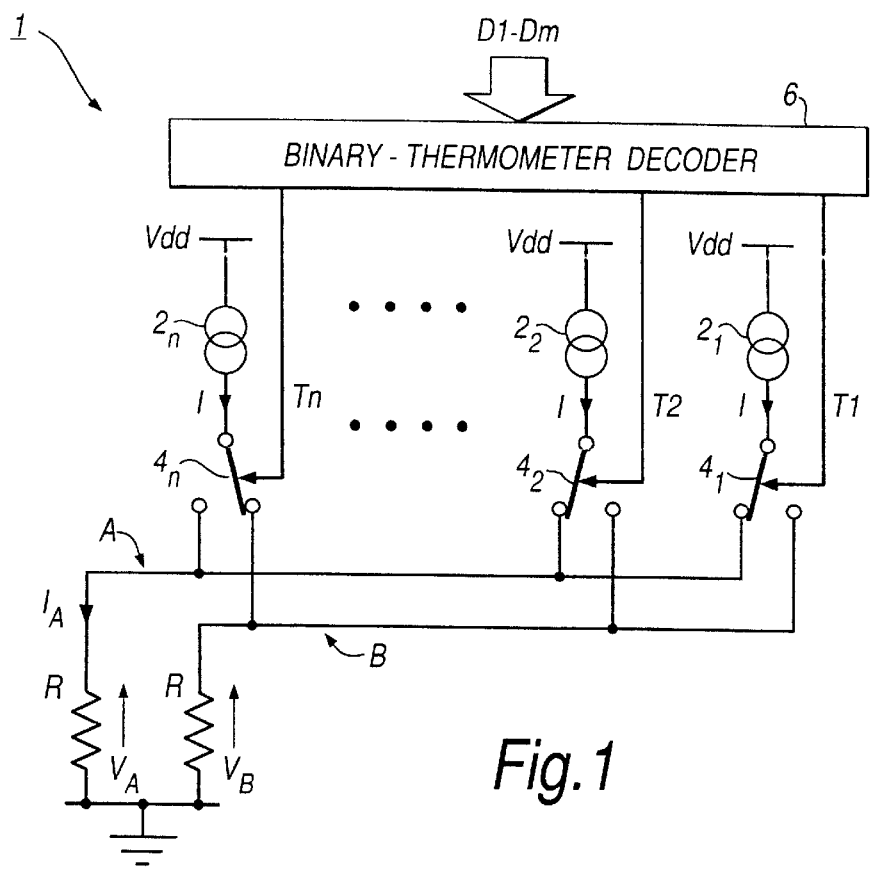
FIG. 1, discussed hereinbefore, shows parts of a previously-considered current-steering DAC.
FIG. 2, also discussed hereinbefore, shows a table for use in explaining how thermometer-coded control signals are derived from a binary input word in the FIG. 1 DAC.
Figure 3:
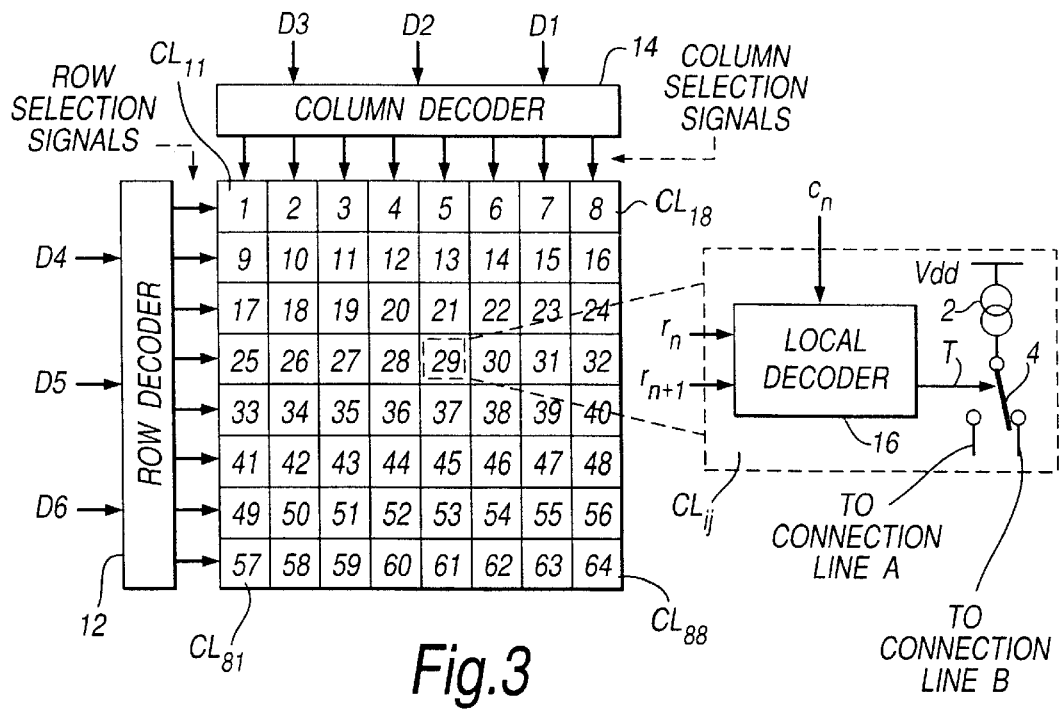
FIG. 3, also discussed hereinbefore, shows parts of cell array circuitry previously considered for use in a DAC.
Figure 4A:
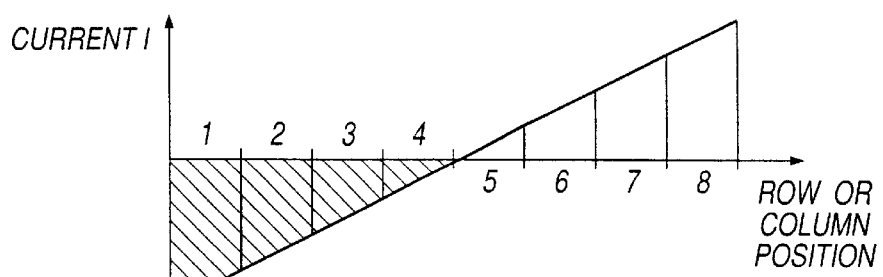
FIGS. 4(A) and 4(B), also discussed hereinbefore, are schematic diagrams for use in explaining the occurrence of graded and symmetrical errors in the cell array circuitry of FIG. 3.
Figure 4B:
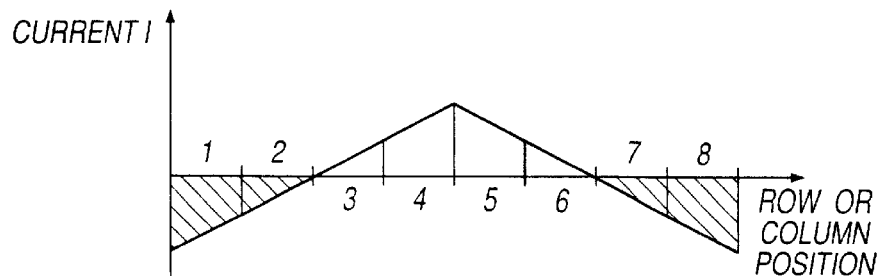
Figure 5:
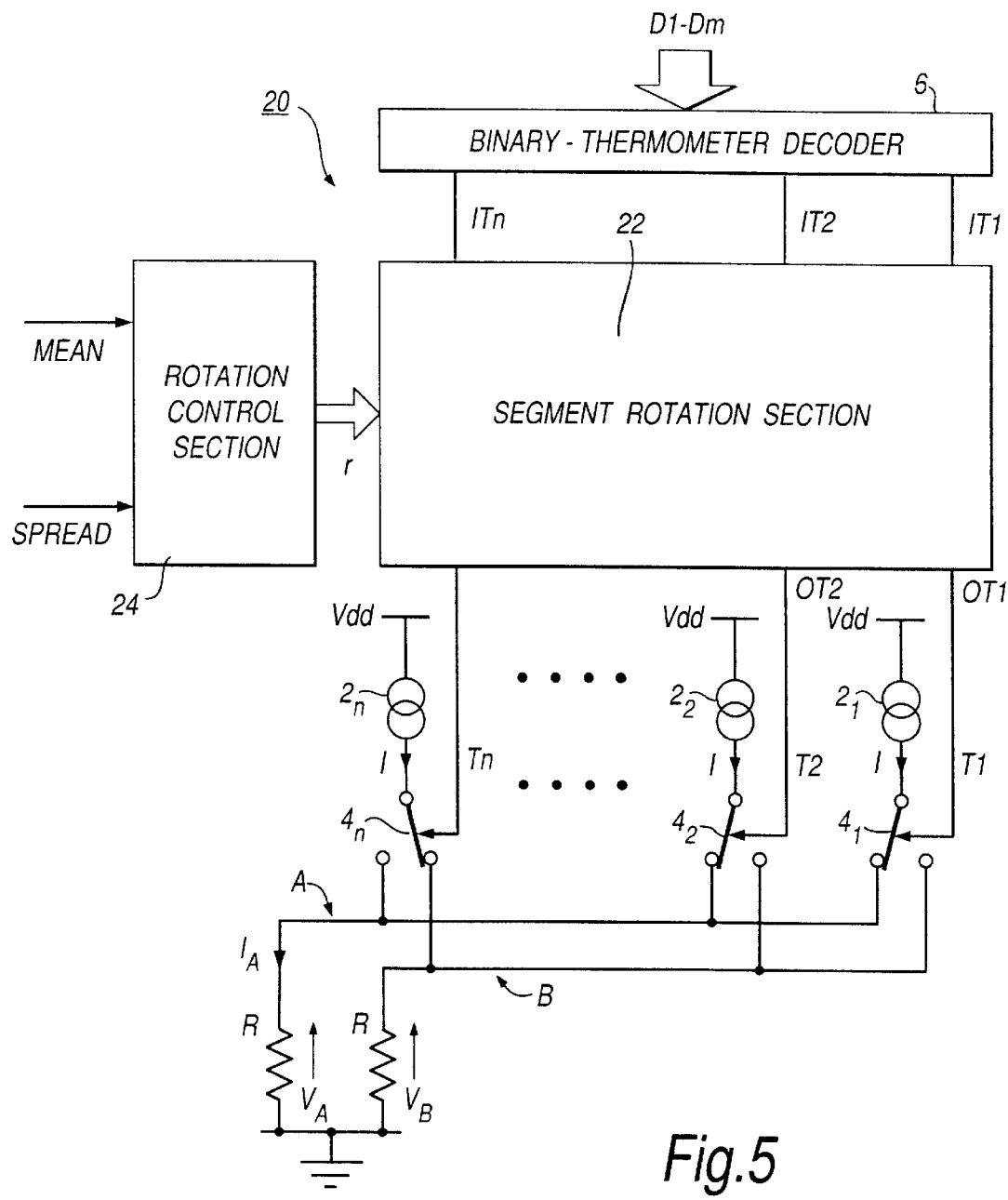
FIG. 5 shows parts of a DAC embodying the present invention.

FIG. 5 shows parts of a DAC 20 embodying the present invention. Parts of the FIG. 5 DAC which are the same as, or correspond closely to, parts of the FIG. 1 DAC discussed hereinbefore are denoted by the same reference numerals, and a description of those parts is omitted.

The FIG. 5 DAC includes a digital circuitry portion DC and an analog circuitry portion AC. The analog circuitry portion AC is constituted in the same way as in the FIG. 1 DAC and includes a plurality of segments (or cells), each segment having a constant current source 2 and a switch 4. The switch 4 in each segment is controlled by an individually-corresponding thermometer-coded signal TO supplied thereto from the digital circuitry portion DC.

In the FIG. 5 DAC, the digital circuitry portion DC includes, in addition to a binary-thermometer decoder 6, a segment rotation section 22 and a rotation control section 24.

The segment rotation section 22 has n inputs at which a set of thermometer-coded input signals IT1 to Itn are received. These thermometer-coded input signals IT1 to ITn are produced by the binary-thermometer decoder 6 based on a binary input word D1–Dm applied to the DAC. The binary-thermometer decoder 6 operates in the same way as described previously with reference to FIGS. 1 and 2 to derive the thermometer-coded input signals IT1 to ITn from the binary input word D1–Dm.

The segment rotation section 22 also has n outputs at which respective ones of the thermometer-coded output signals OT1 to OTn of the digital circuitry DC are generated.

The segment rotation section 22 also has a control input connected to an output of the rotation control section 24 for receiving therefrom a rotation amount r. The rotation control section 24 has first and second inputs for receiving respectively externally-applied control signals MEAN and SPREAD.

Operation of the FIG. 5 DAC will now be described. The DAC performs a series of operation cycles (conversion cycles) at a predetermined operating frequency (sampling rate) $F_{DAC}$. $F_{DAC}$ is, for example, 100 million samples per second (100 Msamples/s).

In each cycle, the binary-thermometer decoder 6 converts the externally-applied input word D1–Dm into the n thermometer-coded signals IT1 to ITn as described previously with reference to FIG. 2.

Also in each cycle, the segment rotation section 22 receives a value of the rotation amount r to be used in that cycle and derives the n thermometer-coded output signals OT1 to OTn from the thermometer-coded input signals IT1 to ITn in accordance with the received r-value.

Figure 6:
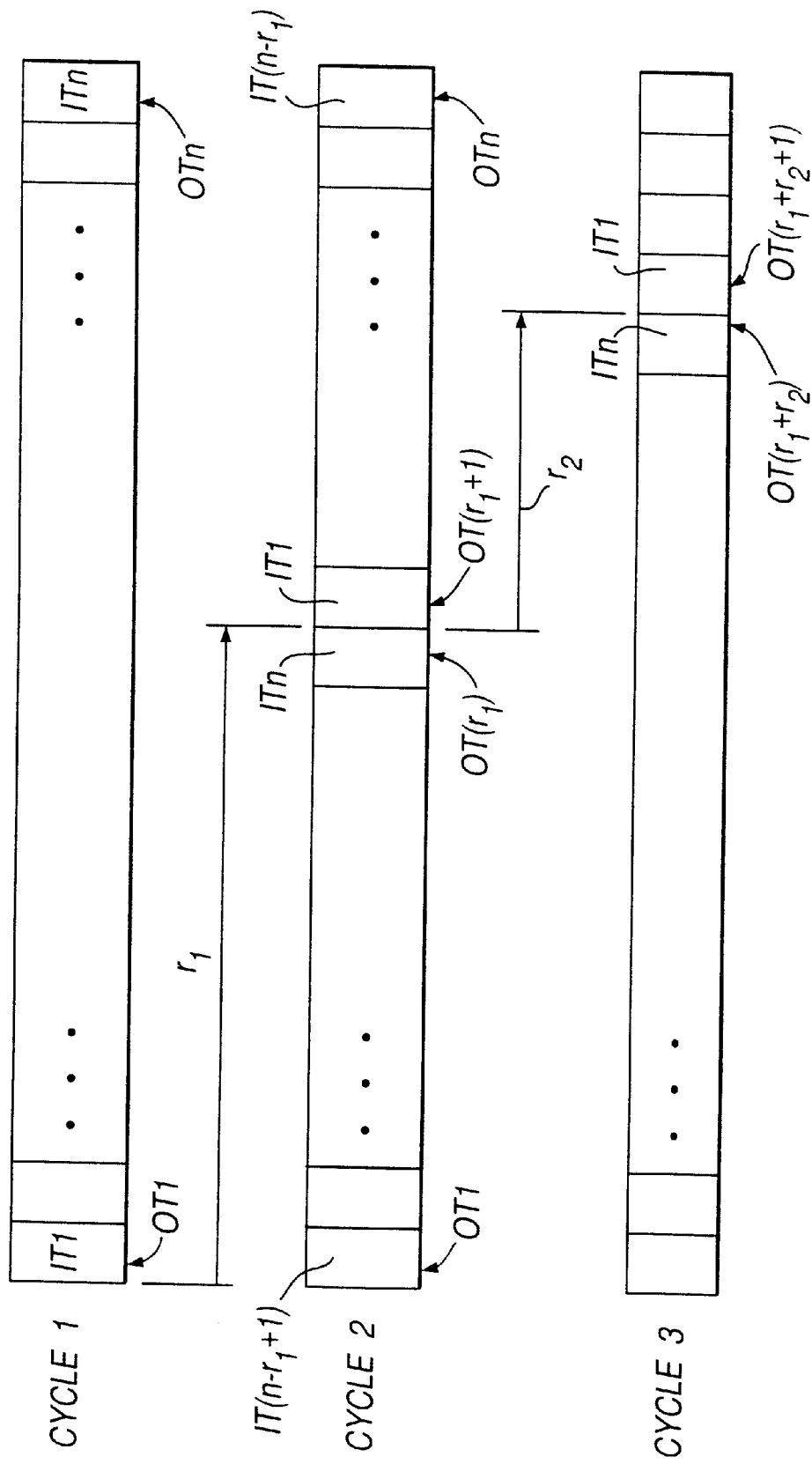
FIG. 6 shows a schematic diagram for use in explaining operation of the FIG. 5 DAC.

The operation of the segment rotation section 22 is illustrated in FIG. 6.

In FIG. 6, the thermometer-coded output signals OT1 to OTn are shown for a series of cycles CYCLE1, CYCLE2 and CYCLE3. In CYCLE1, the segment rotation section 22 makes the first output signal OT1 equal to the first input signal IT1, the second output signal OT2 equal to the second input signal IT2, and so on for all of the remaining output signals OT3 to OTn.

For CYCLE2, a rotation amount $r_1$ is supplied to the segment rotation section 22 by the rotation control section 24. This rotation amount $r_1$ defines a new, rotated mapping of the input signals IT1 to ITn to the output signals OT1 to OTn for CYCLE2, different from the mapping used in CYCLE1. In this rotated mapping each input signal IT1 to ITn is mapped to a new output signal OT1 to OTn which differs, by the rotation amount $r_1$, from the output signal to which it was mapped in the previous cycle. As shown in FIG. 6, this rotation results in the $(r_1+1)$th output signal $TO(r_1+1)$ becoming equal to the first input signal IT1. Similarly the next output signal $TO(r_1+2)$ becomes equal to the second input signal IT2, and so on for successive output signals up to the output signal OTn which becomes equal to the input signal $IT(n-r_1)$. The input signals are mapped to the output signals in circular fashion so that the first output signal OT1 becomes equal to the input signal $IT(n-r1+1)$. The remaining "wrapped around" input signals up to ITn are mapped to the output signals OT2 to $TO(r_1)$.

In the next cycle, CYCLE3, a rotation amount $r_2$ is specified by the rotation control section 24. As explained hereinafter, $r_2$ may be the same as, or different from, the rotation amount $r_1$ used in the previous cycle. As a result of the rotation by $r_2$ segments, the input signal IT1 is mapped to the output signal $TO(r_1+r_2+1)$ in CYCLE3. Successive input signals are then mapped to successive output signals, wrapping around as necessary, the final input signal ITn being mapped to the output signal $TO(r_3+r_2)$.

Before describing the way in which the values of the rotation amount r used in successive cycles are determined by the rotation control section 24 in preferred embodiments of the present invention, the effect of the rotation of the segments will be explained with reference to FIGS. 7(A) to 7(C).

Figure 7A:
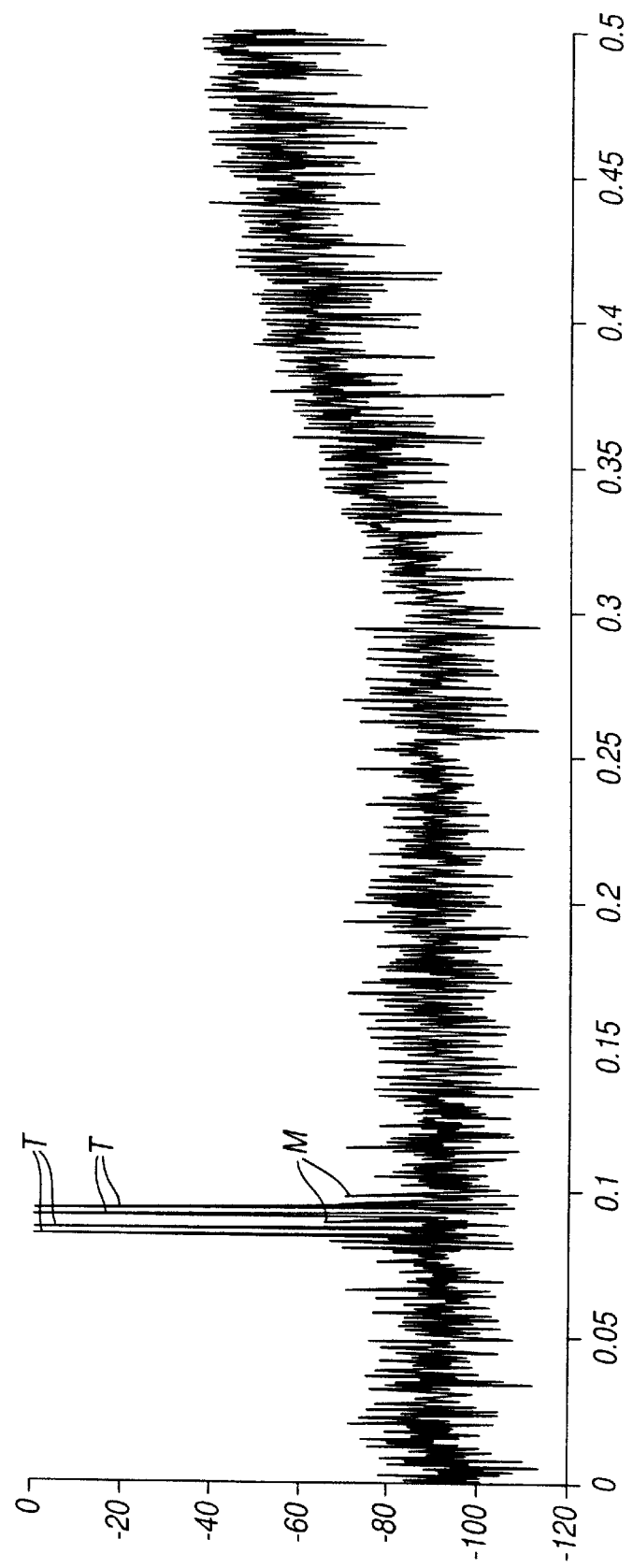
FIG. 7(A) shows a frequency spectrum of an output signal of the FIG. 5 DAC when no segment rotation is carried out.
Figure 7B:
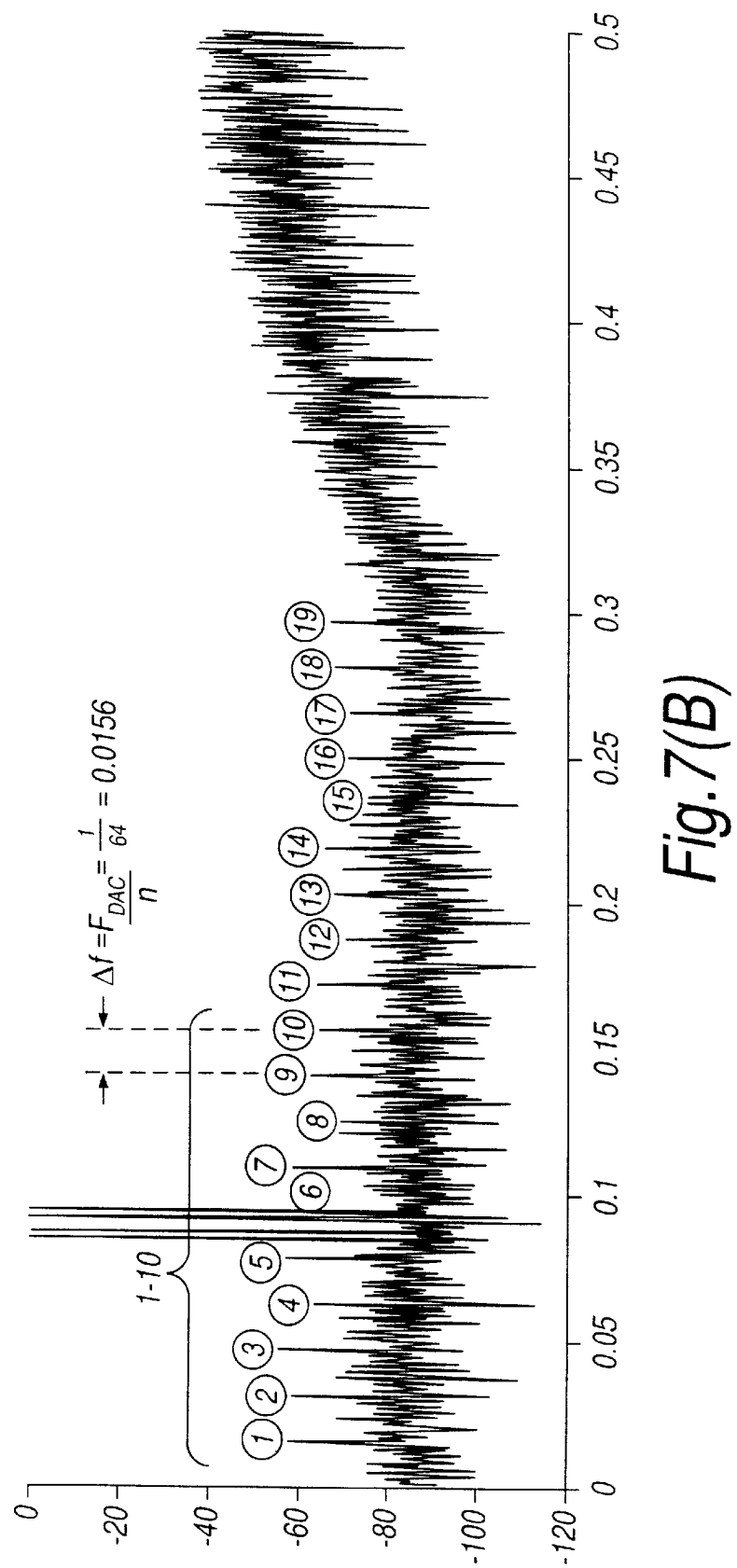
FIG. 7(B) shows the output-signal frequency spectrum of the FIG. 5 DAC when segment rotation is carried out with a rotation amount r=1.
Figure 7C:
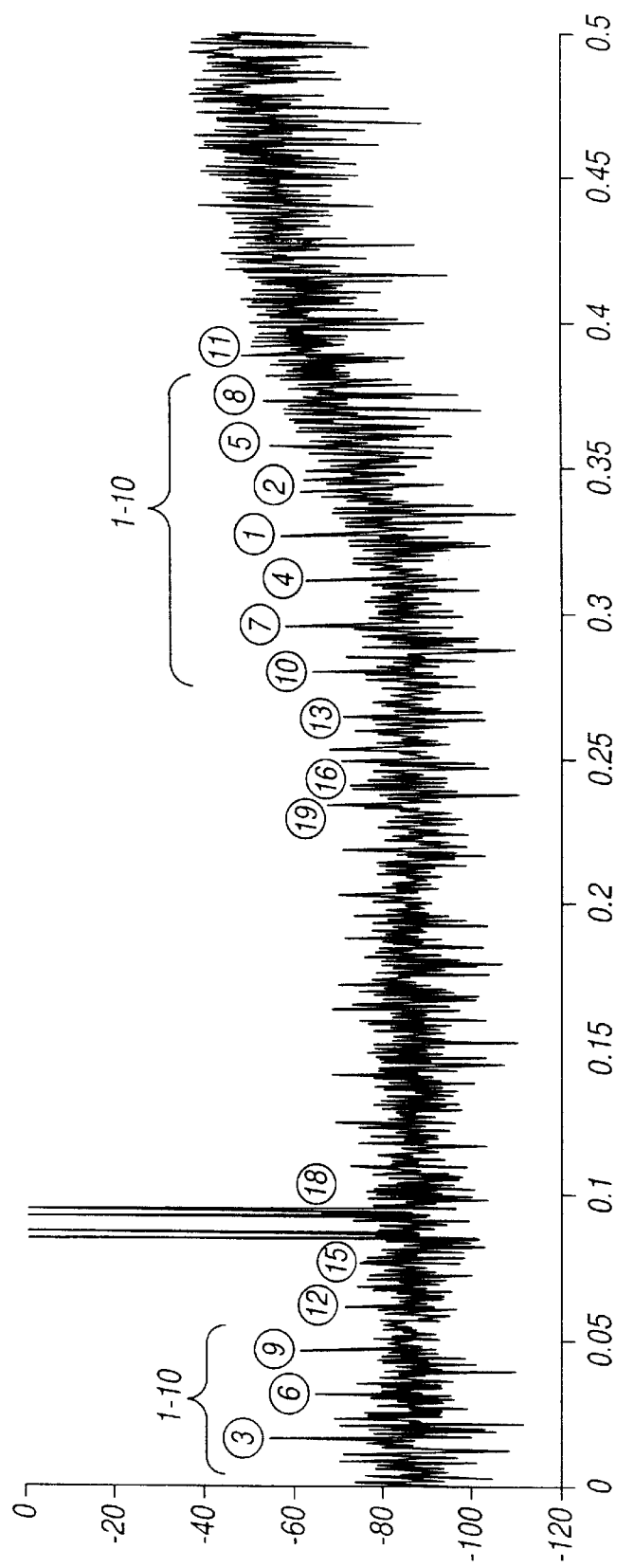
FIG. 7(C) shows the output-signal frequency spectrum of the FIG. 5 DAC when segment rotation is carried out with a rotation amount r=21.

In the examples of FIGS. 7(A) to 7(C), each plot illustrates a signal-to-noise ratio (SNR) of an output signal $(V_A-V_B)$ of the FIG. 5 DAC over a frequency range from DC to a frequency of one half of the DAC sampling rate $F_{DAC}$. In each plot, the SNR represented on the vertical axis is measured in dB, and frequency, represented on the horizontal axis, is measured as a proportion of the sampling rate $F_{DAC}$.

In each example it is assumed that the current sources 2 in the different segments have mismatches with a standard deviation σ of 1.7%. This figure for the standard deviation σ is an artificially high one chosen to emphasise noise components in the output signal spectrum so as to make them large enough to distinguish from background noise. A standard deviation figure σ=0.17% has in practice been achieved in previous DACs.

It is also assumed in this example that the number n of segments is 64.

It will be seen that, in each example, there is a broad noise peak from approximately $0.3F_{DAC}$ to $0.5F_{DAC}$ (the Nyquist frequency). This broad noise peak is the result of high-pass-filtered dither applied to the input data D1–Dm to remove the effect of quantisation errors. For the purposes of the present explanation, this broad noise peak can be ignored.

In the present example, it is assumed that the DAC is being used to synthesize at its output an output signal made up of four "tones" T, i.e. four different frequency components. These four tones are centered around a frequency near to $0.09 F_{DAC}$. Each tone T has a peak amplitude of −13 dB of the full-scale output amplitude FS of the DAC. The peak of the sum of the tones is −1 dB FS.

Incidentally, the output signal is assumed to be made up of four tones in the present example because plural tones make it easier to identify noise components in the output spectrum.

FIG. 7(A) shows the output-signal frequency spectrum when no segment rotation is carried out from one cycle to the next, i.e. r=0 in each cycle. It can be seen that, although the average noise level in the frequency range from DC to $0.3 F_{DAC}$ is around −90 dB, there are a number of significant intermodulation products M at frequencies close to the four tones T. These intermodulation products M are the result of the segment mismatches.

FIG. 7(B) shows the output-signal frequency spectrum when a rotation amount r=1 is used in each cycle. In this case, it can be seen that the intermodulation products M close to the tones T are now absent. Instead, however, the output-signal frequency spectrum contains frequency components labelled 1 to 19 at frequency intervals $\Delta f=F_{DAC}/n$ ($=0.0156 F_{DAC}$ in this example). These frequency components are present in the output-signal frequency spectrum as a result of the segment rotation from one cycle to the next, and are referred to hereinafter as "rotation components".

The first rotation component (component 1) has the frequency rΔf. The second rotation component (component 2) has the frequency 2rΔf, and the third and higher-order rotation components are at frequencies 3rΔf, 4rΔf, etc.

On average, the rotation components decrease in magnitude the higher the order. However, as can be seen in FIG. 7(B), for example, components 1 and 2 are no larger than component 3, contrary to what would be expected on average. This is simply a statistical variation for the particular plot of FIG. 7(B).

When the rotation amount r=1, as in the plot of FIG. 7(B), the most significant components 1 to 10 are all contained within a band of frequencies from DC to $0.16F_{DAC}$. This means that all of the components are in a desired range of output-signal frequencies of the DAC. For example, in a system in which 4x over-sampling is used, the desired range of output-signal frequencies is from DC to $0.125F_{DAC}$.

FIG. 7(C) shows the output-signal frequency spectrum when the rotation amount r=21 in each cycle. The rotation components 1 to 19 are now located very differently from in FIG. 7(B). The first rotation component (component 1) is located at a frequency of 21Δf. Component 2, which should have a frequency of 2rΔf(=42Δf), is mapped to a frequency of 22Δf. This mapping occurs because 42Δf is beyond the Nyquist frequency (n/2)Δf(=32Δf) by +10Δf, so the component maps to (n/2−10)Δf=22Δf. Similarly, component 3 maps to Δf (because 3rΔf(=63Δf) is +31Δf beyond the Nyquist frequency the component maps to (n/2−31)Δf=Δf. Component 4 maps to 20Δf(4rΔf=84Δf is +52Δf beyond the Nyquist frequency, so maps to −20Δf, which being less than 0 maps in turn to +20Δf). The higher-order components are mapped in the same way.

As can be seen from FIG. 7(C), of the 10 lower-order components 1 to 10, only components 3, 6 and 9 are now contained in the desired range from DC to $0.125F_{DAC}$. There are additionally some higher-order components (components 12, 15 and 18) in the desired frequency range, but these are higher-order components of limited significance. Incidentally, the relatively large size (compared to the other components) of the component 18 in FIG. 7(C) is also a statistical variation. On average, the component 18 would be smaller in magnitude than is shown in FIG. 7(C).

Table 1 below indicates the way that the rotation components 1 to 16 are mapped to different positions in the output-signal spectrum for different values of the rotation amount r in the range from 20 to 31. The mapping values in the table denote the frequency (expressed as a multiple of Δf) to which the rotation component concerned is mapped. As shown in Table 1, when the desired range of output-signal frequencies is from DC to $0.12F_{DAC}$ (i.e. 4x oversampling) preferred values of the rotation amount r are values for which the associated column of mapping values has no relatively small values amongst the first few items of the column. In this respect, it can be seen that the columns associated with r values of 24, 25, 26 and 27 are preferable. For example, in the case of r=24, it can be seen that the positions of components 1, 2 and 4 are good (all at 16Δf or higher) but the positions of components of 3 and 5 (both at 8Δf) are less preferable. Similarly, in the case of r=25, the locations of components 1 to 4 are all good (+11Δf or more) but the position of component 5 at 3Δf is less preferable. In fact, amongst the r values from 24 to 27, the values 25 and 26 can be considered to be preferred values as for each of these only component 5, which is of much less significance than, say, component 2 or 3, is in the desired range for 4x oversampling.

TABLE 1

| Component | ROTATION AMOUNT r | | | | | | | | | | | |
|---|---|---|---|---|---|---|---|---|---|---|---|---|
| | 31 | 30 | 29 | 28 | 27 | 26 | 25 | 24 | 23 | 22 | 21 | 20 |
| 1 | 31 | 30 | 29 | 28 | 27 | 26 | 25 | 24 | 23 | 22 | 21 | 20 |
| 2 | 2 | 4 | 6 | 8 | 10 | 12 | 14 | 16 | 18 | 20 | 22 | 24 |
| 3 | 29 | 26 | 23 | 20 | 17 | 14 | 11 | 8 | 5 | 2 | 1 | 4 |
| 4 | 4 | 8 | 12 | 16 | 20 | 24 | 28 | 32 | 28 | 24 | 20 | 16 |
| 5 | 27 | 22 | 17 | 12 | 7 | 2 | 3 | 8 | 13 | 18 | 23 | 28 |
| 6 | 6 | 12 | 18 | 24 | 30 | 28 | 22 | 16 | 10 | 4 | 2 | 8 |
| 7 | 25 | 18 | 11 | 4 | 3 | 10 | 17 | 24 | 31 | 26 | 19 | 12 |
| 8 | 8 | 16 | 24 | 32 | 24 | 16 | 8 | 0 | 8 | 16 | 24 | 32 |
| 9 | 23 | 14 | 5 | 4 | 13 | 22 | 31 | 24 | 15 | 6 | 3 | 12 |
| 10 | 10 | 20 | 30 | 24 | 14 | 4 | 6 | 16 | 26 | 28 | 18 | 8 |
| 11 | 21 | 10 | 1 | 12 | 23 | 30 | 19 | 8 | 3 | 14 | 25 | 28 |
| 12 | 12 | 24 | 28 | 16 | 4 | 8 | 20 | 32 | 20 | 8 | 4 | 16 |
| 13 | 19 | 6 | 7 | 20 | 31 | 18 | 5 | 8 | 21 | 30 | 17 | 4 |
| 14 | 14 | 28 | 22 | 8 | 6 | 20 | 30 | 16 | 2 | 12 | 26 | 24 |
| 15 | 17 | 2 | 13 | 28 | 21 | 6 | 9 | 24 | 25 | 10 | 5 | 20 |
| 16 | 16 | 32 | 16 | 0 | 16 | 32 | 16 | 0 | 16 | 32 | 16 | 0 |

The significance of the r-values 25 and 26 is that they are close to an ideal value (at least in the particular case of 4x oversampling) at which r/n=0.4. This value of 0.4 is an ideal value because the rotation components all map to $0.4F_{DAC}$ or to $0.2F_{DAC}$ or to DC. In particular, component 1 is mapped to $0.4F_{DAC}$, component 2 is mapped to $0.2F_{DAC}$ (because $0.8=(0.5+0.3)F_{DAC} \rightarrow 0.2(=0.5-0.3)F_{DAC}$). Component 3 is at $0.2F_{DAC}$ (because $1.2(=0.5+0.7)F_{DAC} \rightarrow -0.2(=0.5-0.7)F_{DAC} \rightarrow 0.2F_{DAC}$). Component $4 \rightarrow 0.4F_{DAC}$ (because $1.6(=0.5+1.1)F_{DAC} \rightarrow -0.6(=0.5-1.1)F_{DAC} \rightarrow +0.6(=0.5+0.1)F_{DAC} \rightarrow +0.4(=0.5-0.1)F_{DAC}$). Component 5 maps to DC (because $2.0(=0.5+1.5)F_{DAC} \rightarrow -1.0(=0.5-1.5)F_{DAC} \rightarrow +1.0(=0.5+0.5)F_{DAC} \rightarrow 0(0.5-0.5)F_{DAC}$). This pattern is repeated for every set of five higher-order components, i.e. components 6 to 10 map to the same positions as components 1 to 5 respectively, and so on.

The effect of the mapping when r/n=0.4 is to move the noise into three narrow bands centred at $0.4F_{DAC}$, $0.2F_{DAC}$ and DC. The band having the highest noise is the band centred at $0.4F_{DAC}$ (because it has components 1 and 4 of each set of five components (1–5, 6–10, 11–15, etc.)), the next most-significant band is centred at $0.2F_{DAC}$ (it has components 2 and 3 of each set), and the band centred at DC having still less noise (component 5 only of each set). It will be appreciated that this leaves free of significant noise components a range of frequencies from just above DC to $0.125F_{DAC}$, as is desired 4x oversampling. A desired range of frequencies (passband) from 0.06 to $0.11F_{DAC}$ could be used, free of significant noise components.

It will be appreciated that the ideal r/n value of 0.4 will generally require a non-integer value of the rotation amount r. For example, when n=64, r should be set to the non-integer value 25.6. Non-integer values of r can effectively be achieved by varying r from one cycle to the next so that on average it has the required value. In practice, it is found advantageous to vary r in a random or pseudo-random manner so that on average it has the required value. This random/pseudo-random variation in practice provides for improved noise shaping compared to the situation in which r is constant or is varied in a regular (predetermined) pattern.

For example, when n=64, r could be varied pseudo-randomly to have the values 24, 25, 26 and 27, each for 25% of the conversion cycles, to give an average r value of 25.5.

Many combinations of integer values can be used to "spread" r whilst producing the same average r value. For example, the average r value of 25.5 could be achieved by selecting on a pseudo-random basis between not rotating the segments at all (r=0) and rotating by 51 segments, each for 50% of the conversion cycles on average. However, this has the effect in practice of making the noise more "peaky" than when the r value is produced by spreading amongst the possible values 24, 25, 26 and 27. It is believed that the values used to spread r should preferably be values which, if used individually, would tend to place the noise in the appropriate narrow bands such as the bands centred on $0.4F_{DAC}$, $0.2F_{DAC}$ and DC as in the case of the integer values 24, 25, 26 and 27. Spreading appears to have the effect that higher-order rotation components are reduced in amplitude and distributed more in frequency.

When n=128, for r/n=0.4, r should be set to the non-integer value 51.2. For example, r could be varied randomly or pseudo-randomly to have an average value of 51.25 using nine spreading values from 47 to 55, the end values 47 and 55 each for 6.25% of the conversion cycles, and the intermediate values 48 to 54 each for 12.5% of the conversion cycles. Alternatively, five spreading values from 49 to 53 could be used, the end values 49 and 53 each for 12.5% of the conversion cycles, and the intermediate values 50, 51 and 52 each for 25% of the conversion cycles.

Table 2 below shows the way in which the rotation components 1 to 16 are mapped to different positions in the output-signal frequency spectrum for integer values of r from 46 to 56, when n=128.

TABLE 2

| Component | ROTATION AMOUNT r | | | | | | | | | | |
|---|---|---|---|---|---|---|---|---|---|---|---|
| | 56 | 55 | 54 | 53 | 52 | 51 | 50 | 49 | 48 | 47 | 46 |
| 1 | 56 | 55 | 54 | 53 | 52 | 51 | 50 | 49 | 48 | 47 | 46 |
| 2 | 16 | 18 | 20 | 22 | 24 | 26 | 28 | 30 | 32 | 34 | 36 |
| 3 | 40 | 37 | 34 | 31 | 28 | 25 | 22 | 19 | 16 | 13 | 10 |
| 4 | 32 | 36 | 40 | 44 | 48 | 52 | 56 | 60 | 64 | 60 | 56 |
| 5 | 24 | 19 | 14 | 9 | 4 | 1 | 6 | 11 | 16 | 21 | 26 |
| 6 | 48 | 54 | 60 | 62 | 56 | 50 | 44 | 38 | 32 | 26 | 20 |
| 7 | 8 | 1 | 6 | 13 | 20 | 27 | 34 | 41 | 48 | 55 | 62 |
| 8 | 64 | 56 | 48 | 40 | 32 | 24 | 16 | 8 | 0 | 8 | 16 |
| 10 | 48 | 38 | 28 | 18 | 8 | 2 | 12 | 22 | 32 | 42 | 52 |
| 11 | 24 | 35 | 46 | 57 | 60 | 49 | 38 | 27 | 16 | 5 | 6 |

TABLE 2-continued

| Component | ROTATION AMOUNT r | | | | | | | | | | |
|---|---|---|---|---|---|---|---|---|---|---|---|
| | 56 | 55 | 54 | 53 | 52 | 51 | 50 | 49 | 48 | 47 | 46 |
| 12 | 32 | 20 | 8 | 4 | 16 | 28 | 40 | 52 | 64 | 52 | 40 |
| 13 | 40 | 53 | 62 | 49 | 36 | 23 | 10 | 3 | 16 | 29 | 42 |
| 14 | 16 | 2 | 12 | 26 | 40 | 54 | 60 | 46 | 32 | 18 | 4 |
| 15 | 56 | 57 | 42 | 27 | 12 | 3 | 18 | 33 | 48 | 63 | 50 |
| 16 | 0 | 16 | 32 | 48 | 64 | 48 | 32 | 16 | 0 | 16 | 32 |

Also, Tables 3 to 7 indicate the effects of different amounts of spreading of the r value to achieve the same average value of 51.25. In Tables 3 to 7, the standard deviation o of the segment mismatches is assumed to be 0.24% which, for a DAC having 128 segments, is equivalent to a mismatch standard deviation of 0.17% in a 64-segment DAC.

In Table 3 no spreading is applied, and the rotation amount is 51.25 per cycle. This is achieved by incrementing a counter by 51.25 per cycle and rounding the count value to an integer value, or by incrementing a counter by 51.75 per cycle and truncating the count value to an integer value. (Truncating requires an increment of 0.5 more per cycle than rounding, because it produces an average downward shift per cycle of 0.5). In Tables 4 to 7, the spreading amounts are 2, 4, 8 and 16 respectively, each with an average r value of 51.25.

TABLE 3

| | Mean | Sigma | Min | Max |
|---|---|---|---|---|
| A | 86.7 | 1.38 | 84.3 | 88.8 |
| B | 94.0 | 2.88 | 89.6 | 97.5 |
| C | 92.9 | 1.82 | 90.2 | 95.1 |
| D | 104.5 | 3.39 | 99.1 | 108.0 |

TABLE 4

| | Mean | Sigma | Min | Max |
|---|---|---|---|---|
| A | 84.9 | 2.00 | 82.8 | 89.0 |
| B | 101.8 | 3.78 | 97.9 | 109.3 |
| C | 90.9 | 1.71 | 89.2 | 94.7 |
| D | 106.8 | 2.51 | 102.3 | 111.4 |

TABLE 5

| | Mean | Sigma | Min | Max |
|---|---|---|---|---|
| A | 85.9 | 0.60 | 85.1 | 87.1 |
| B | 106.4 | 1.41 | 104.6 | 108.3 |
| C | 90.9 | 0.40 | 90.3 | 91.5 |
| D | 108.0 | 1.30 | 105.1 | 109.7 |

TABLE 6

| | Mean | Sigma | Min | Max |
|---|---|---|---|---|
| A | 86.1 | 1.94 | 83.5 | 89.5 |
| D | 108.5 | 2.41 | 105.1 | 112.6 |
| C | 90.6 | 1.74 | 87.6 | 93.5 |
| D | 109.9 | 2.08 | 105.5 | 113.0 |

TABLE 7

| | Mean | Sigma | Min | Max |
|---|---|---|---|---|
| A | 84.0 | 1.54 | 81.6 | 85.7 |
| B | 107.0 | 1.75 | 104.4 | 109.0 |
| C | 87.9 | 1.70 | 85.2 | 89.6 |
| D | 107.3 | 1.95 | 104.4 | 109.4 |

In Tables 3 to 7 the measures A to D denote measures of noise performance of the DAC over different desired ranges of frequency, as follows. The frequency range for measure A is from DC to 15/128 (≈0.12)$F_{DAC}$, i.e. a baseband for 4x oversampling. The frequency range for measure C is from 8.5/128 to 14/128 (≈0.0664 to 0.1094)$F_{DAC}$, i.e. a passband for 4x oversampling. Measure B represents the noise level of the worst (noisiest) narrow band amongst all available narrow bands over the measure-A frequency range. Similarly, measure D represents the noise level of the worst (noisiest) narrow band amongst all available narrow bands over the measure-C frequency range. Each narrow band in this example is assumed to have a frequency range of 1/4000 of the measure-A frequency range, i.e. ≈30×$\times 10^{-6}F_{DAC}$.

These measures are used in view of the possible use of a DAC embodying the present invention in a mobile communication network such as a GSM network. In such a network, it may be desired to use a baseband frequency range (e.g. 5–40 MHz) corresponding to measure A, or a passband frequency range (e.g. 40–75 MHz) corresponding to measure C. Measures B and D correspond to a worst-case channel of the network within the baseband and baseband respectively, each channel having a frequency range of e.g. 200 KHz. In the baseband case (e.g. 5–40 MHz) the harmonics are relatively small but are located in-band, whereas in the passband case (e.g. 40–75 MHz) the harmonics are relatively large but are located out of band (e.g. $2^{nd}$ harmonic of 40 MHz is at 80 MHz, and the intermodulation product of 40 MHz and 75 MHz is at 35 MHz).

For each different measure A to D at each different spreading amount, a number of simulations were performed, and the following statistical information was derived in each case: the mean noise level (mean) over the desired frequency range (or worst-case narrow band for measures B and D), the standard deviation (sigma) of the noise over that range/band, the minimum noise level (min) over that range/band and the maximum noise level (max) over that range/band. All values in the Tables are negative values, expressed in dB FS, i.e. relative to the full-scale output FS of the DAC.

Figure 8B:
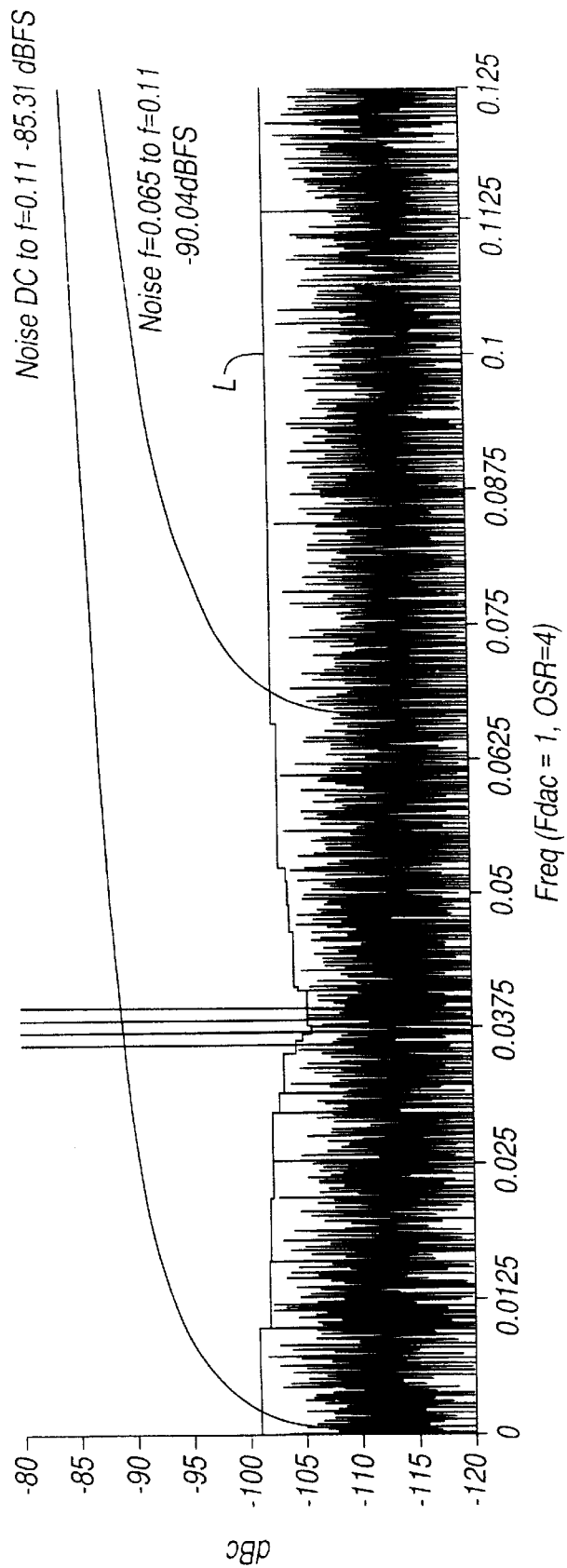
FIG. 8(B) shows an enlarged portion of the FIG. 8(A) output-signal frequency spectrum.

The input of the DAC in the simulations was four tones, as shown in FIGS. 8(A) and 8(B), each having an amplitude of −13 dB FS, and the sampling rate FDAC was 832 MHz. This figure was selected to deal with input data at up to 45 MHz, corresponding to a minimum sampling rate of 90 Msamples/s. The nearest "preferred" rate in GSM (multiples of 13 MHz) is 104 Msamples/s and, with 8× oversampling, this translates to $F_{DAC}$=832 MHz.

The results shown in Table 6, for the case in which the amount of spreading is 8, provides the best overall noise performance in this example. The noise is then nearly flat over a desired range of frequencies for 4x oversampling of DC to 0.11$F_{DAC}$, as shown in FIGS. 8(A) and 8(B).

FIG. 8(A) shows the frequency spectrum of the output signal from 0 to 0.5$F_{DAC}$ with, in this case, an output signal made up of four tones centred on a frequency of 0.035$F_{DAC}$. As expected, the noise has peaks at 0.2$F_{DAC}$ and 0.4$F_{DAC}$. There is a slight peak at DC too. The further peaks on either side of the main peaks at 0.2$F_{DAC}$ and 0.4$F_{DAC}$ represents inter- modulation noise (the intervals of approximately $0.035F_{DAC}$ between these further peaks correspond to the centre frequency of the four tones). FIG. 8(B) shows, to an enlarged horizontal scale, the noise in the section from DC to $0.125F_{DAC}$ in FIG. 8(A), which is the section of interest with 4x over- sampling. In FIG. 8(B), the line L denotes a spurious-free dynamic range (SFDR) of the DAC. The SFDR is a measure of the difference, in dB, between the rms amplitude of the output signal and the peak spurious signal over the specified bandwidth. Incidentally, in FIGS. 8(A) and 8(B) the noise is measured in dBc, i.e. relative to the carrier, which in these simulations has a level of −13 dB FS. Thus OdBc=−13 dB FS.

In FIG. 8(B) the slight noise peak near to DC can be seen from the line L, as well as the overall uniformity of the noise over the baseband and, especially, over the passband. Over the baseband, the noise level in the plot is −85.31 dB FS, while over the passband the noise level in the plot is −90.04 dB FS. (These figures are close to but not exactly the same as the corresponding "mean" figures (−86.1 dB FS and −90.6 dB FS) in Table 6 which relates to FIGS. 8(A) and 8(B) because the plots of FIGS. 8(A) and 8(B) represent just one "run" of the simulation, whereas the figures in Table 6 are obtained on the basis of several runs, to make them statistically more valid).

To show the improvement that is obtained by the rotation with r/n=0.4, the values in Tables 3 to 7 can be compared with the following values obtained when no rotation is used: mean =−71.7 dB FS, σ=4.2 dB FS, minimum noise =−66.7 dB FS and maximum noise =−78.7 dB FS. In the case of a spreading amount of 8, as in Table 6, improvements in measures A and C of 15 dB and 19 dB respectively are achieved.

The mean measure-A noise figure of −86.1 dB in Table 6 corresponds to an SFDR figure of −165.6 dBFS/Hz (because the bandwidth for measure A is 90 MHz, the equivalent noise figure per hertz is 79.5 dB better than the mean figure of −86.1 dB). The corresponding bandwidths for measures B and D are 200 kHz in each case, and for measure C the bandwidth is 35 MHz. Thus, the SFDR figures for measures B to D in Table 6 are −161.5, −166.0 and −162.9 dBFS/Hz respectively.

It will also be seen from a comparison of Tables 3 to 7 that the measures A and C noise figures are worse when spreading is carried out (Tables 4 to 7) than when no spreading is carried out (Table 3). Thus, the total noise is increased by spreading. However, when measures B and D are compared, the spreading brings about significant improvements in the noise level of the worst-case narrow band (channel), the best improvements being obtained in the Table 6 case. These improvements arise because spreading distributes the noise more evenly across the wider band of interest and therefore reduces or removes the number of high-noise individual narrow bands across the wider band. The performance for the worst-case narrow band is therefore greatly improved.

The significance of this in system terms such as in a GSM network is that either more carriers can be synthesised (e.g. 4 or 8 instead of 2 at present) in the DAC, or if the same number of carriers is used there is a greater margin for distortion and noise. In the former case (increased number of carriers per DAC) the economics of the network are shifted in favour of using a high-performance (relatively expensive) DAC to provide more channels per DAC and away from using a lower-performance, but cheaper, DAC to provide less channels per DAC.

Figure 9:
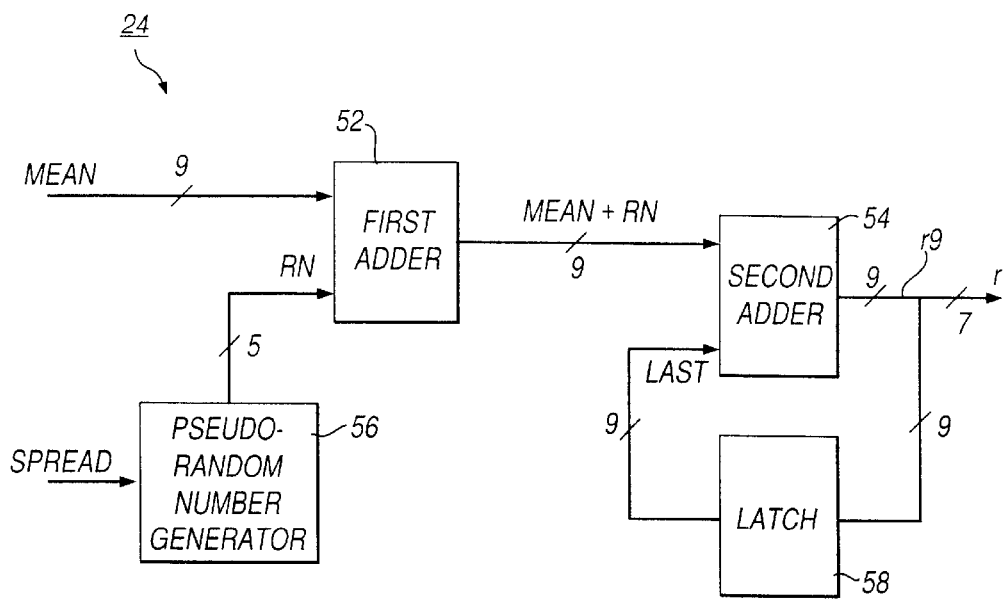
FIG. 9 is a block diagram showing an example of the constitution of a rotation control section of the FIG. 5 DAC.

FIG. 9 shows an example of the constitution of the rotation control section 24 in the FIG. 5 DAC. The rotation control section 24 comprises a first adder 52, a second adder 54, a pseudo-random number generator 56, and a latch 58. The first adder 52 has a first input for receiving the control signal MEAN which, in this example, is a 9-bit integer value (for reasons that will be explained hereinafter). The first adder 52 also has a second input connected to an output of the pseudo-random number generator 56 for receiving therefrom a random number RN in each conversion cycle of the DAC. The pseudo-random number generator 56 has an input at which it receives the control signal SPREAD. The range of pseudo-random numbers RN generated by the generator 56 is determined by the control signal SPREAD applied thereto. In this embodiment, the generator 56 generates integer random numbers in the range from −SPREAD/2 to +SPREAD/2, each integer number being generated with the same frequency on average.

An output of the first adder 52 is connected to a first input of the second adder 54 for applying thereto the sum MEAN+RN of the signals MEAN and RN applied to the two inputs of the first adder 52. The second adder 54 also has a second input connected to an output of the latch 58 for receiving therefrom a 9-bit value LAST. An output of the second adder 54 is connected to an input of the latch 58 for applying thereto an internal signal r9. The signal r9 is a 9-bit value. An output signal r of the section is provided by the seven most significant bits of the r9 signal in this embodiment.

Operation of the FIG. 9 circuitry will now be described. The control signals MEAN and SPREAD are, in this embodiment, externally-applied control signals determined by a user of the DAC. In this embodiment it is assumed that the number n of segments is 128 and that 4x oversampling is used in the DAC, so that, as described previously, an average r value in each cycle is to be as close as possible to a value at which r/n =0.4. This can be achieved, as previously explained, by making the average r value have the non-integer value of 51.25. Because truncation is employed in this embodiment, this average r value of 51.25 requires an increment value per cycle of 51.75 (=51.25+0.5, where 0.5 is the average decrease per cycle resulting from truncation). 51.75 is equal to the integer value 207 divided by four, and so MEAN is set to 207. To achieve a near-optimal spread of r values when MEAN is set to 207, the SPREAD value applied to the pseudo-random number generator 56 is 32 (=8×4) in this embodiment. This results in the generator 56 producing pseudo-random integer values RN in the range from −16 to +16, resulting in the sum MEAN+RN at the output of the first adder being in the range from 191 to 223 (equivalent to r in the range from 47.25 to 55.25).

The value LAST applied to the second input of the second adder 54 in each cycle represents the running total of all of the MEAN+RN values produced by the first adder 52 in previous cycles. In this respect, in each conversion cycle the second adder outputs an r9 value representing the sum of the LAST value and the MEAN+RN value and the r9 value so produced is stored in the latch 58. In each conversion cycle the latch 58 also outputs, as the LAST value, the r9 value received by it in the previous cycle.

The r9 value is a 9-bit value, of which (in this embodiment) the two least significant bits can be regarded as being to the right of the binary point and the seven most significant bits can be regarded as being to the left of the binary point. The seven bits to the left of the binary point are output as a 7-bit r value for the cycle concerned, i.e. r is truncated. The r value is required to have 7 bits as there are 128 (=$2^7$) segments in its embodiment. Rounding of the r-value can be performed instead of truncation, in which case MEAN would be set to 205 (=51.25×4) in this example.

Incidentally, any carry which occurs in the second adder 54 can be neglected as the segment rotation is carried out in a circular manner amongst the 128 segments, as described previously with reference to FIG. 6. Thus, it is only necessary to maintain the r9 and LAST values to a precision of 9-bits.

It will be appreciated that the MEAN and SPREAD values, used by way of example in the above description with reference to FIG. 9, are only for illustration purposes. Other suitable values can be used, and the number of bits with which each value is represented can be adjusted to suit whatever values are chosen.

Figure 10:
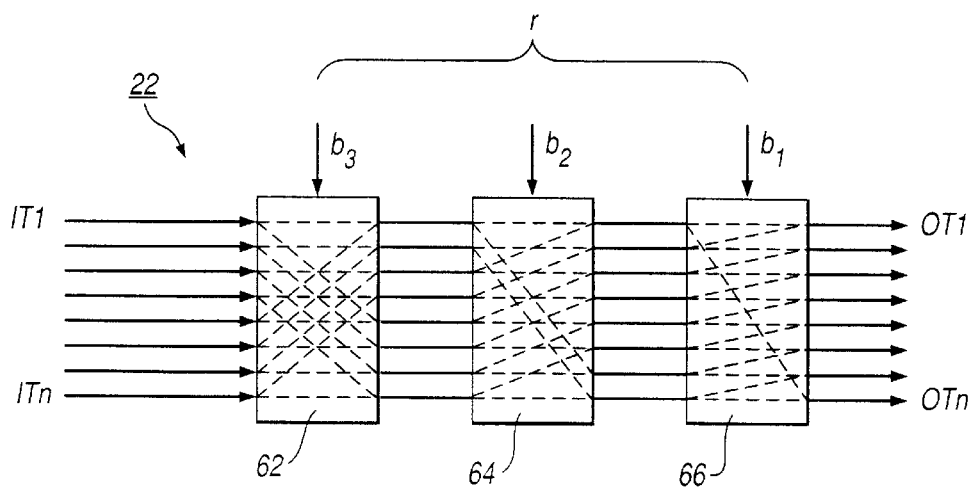
FIG. 10 is a block diagram for use in explaining the constitution of a segment rotation section of the FIG. 5 DAC.

Next, FIG. 10 is an explanatory block diagram for use in explaining the constitution of the segment rotation section 22 in the FIG. 5 DAC. For the sake of simplicity, it is assumed in FIG. 10 that there are only n=8 segments in the DAC.

The FIG. 10 circuitry is made up of first, second and third multiplexer elements 62, 64 and 66. Each multiplexer element has n inputs and n outputs, the outputs of the first multiplexer element 62 being connected respectively to the inputs of the second multiplexer element 64, and the outputs of the second multiplexer element 64 being connected to the inputs of the third multiplexer element 66. The thermometer-coded input signals IT1 to ITn are applied respectively to the inputs of the first multiplexer element 62, and the thermometer-coded output signals OT1 to OTn are produced at the outputs of the third multiplexer element 66.

Each multiplexer element also has a control input b which is provided by an individually-corresponding one of the bits of the r value produced by the rotation control section 24. As shown in FIG. 10 itself, each multiplexer-element input has an associated pair of outputs and makes a connection between the input concerned and a selected one of the associated pair of outputs at any given time. The output selection is made in accordance with the control signal b applied to the element.

In the case of the third multiplexer element 66, which receives the control signal $b_1$ (first bit of the r value), each input is connected to the output directly opposite it in FIG. 10 when the $b_1$ control signal has the value 0. When the $b_1$ control signal has the value 1, each input is connected to the output that is immediately above the directly-opposite output (in the case of the uppermost input the "immediately-above" output is the lowermost output of the element). The effect of the third multiplexer element 66 is therefore to rotate the thermometer-coded output signals, relative to the thermometer-coded input signals, by 0 or 1 segment in accordance with the $b_1$ control signal.

Similarly, the second multiplexer element 64 serves to rotate the output signals relative to the input signals by 0 or 2 segments in accordance with the value of the $b_2$ control signal (i.e. the second bit of the r value). The first multiplexer element 62 serves to rotate the output signals relative to the input signals by 0 or 4 segments in accordance with the value of the $b_3$ control signal (i.e. the third bit of the r value).

To deal with more segments, it is simply necessary to add further higher-order rotation stages, each rotation stage having a multiplexer element similar to the multiplexer elements 62 to 66 in FIG. 10. Each multiplexer element must have n inputs and n outputs, where n is the number of segments, and have its control signal provided by one of the bits of the r value. The multiplexer element controlled by the fourth bit of the r value would serve to rotate the output signals relative to the input signals by 0 or 8 segments, and so on for each higher-order rotation stage.

Incidentally, referring back to FIG. 2, it will be appreciated that the number of thermometer-coded signals which can be produced from an m-bit binary input word is $2^m$, but these $2^m$ different values can be represented by $2^m-1$ thermometer-coded signals. For example when m=3, the eight different possible combinations of thermometer-coded signals produced by the binary-thermometer decoder 6 can be represented using 7 thermometer-coded signals. The rotations performed by the multiplexer elements in the FIG. 10 circuitry must be integer powers of 2 (1, 2, 4, . . . ) and will typically be designed to have numbers of inputs and outputs which are also integer powers of 2. In this case, a "dummy" thermometer-coded signal, set permanently to 0 or 1, can be applied to the segment rotation section 22 as the n-th thermometer-coded input signal. This effectively means that, in any given conversion cycle, there is always one segment whose state is not determined by the binary input word but is in a predetermined state.

Although in the embodiments described above the segment rotation has been carried out to map the rotation components in the output-signal frequency spectrum to preselected locations ($0.4F_{DAC}$, $0.2F_{DAC}$ and DC), it will be appreciated that, in other embodiments of the present invention, different values of the ratio between r and n can be used to achieve other beneficial mappings of the rotation components. The mapping most suitable in each particular application is dependent on a variety of factors, notably the desired range of output-signal frequencies which the DAC is to produce, and the oversampling ratio (if any).

For example, when 2x oversampling is used, random rotation with an average r value of 31.5 places the main noise at $0.5F_{DAC}$, with lower noise at DC, and leaves clean a passband from $0.1F_{DAC}$ to $0.3F_{DAC}$. The average r value of 31.5 can be produced in a variety of ways, but values of 31 and 32, each for 50% of the conversion cycles, can be used.

In the case of no oversampling (sometimes referred to as 1x oversampling), random rotation with an average r value of 0.5 places the main noise close to DC, e.g. in the band from DC to $0.1F_{DAC}$. For example, r values of 0 and 1 each for 50% of the time, could be used to produce the required average r value 0.5. In this case, when, for example, low-pass-filtered dither is applied to the data input to the DAC the dither will affect the lower part of the available band. Dither may stop, for example, at $0.1F_{DAC}$ leaving clean a passband from that frequency up to $0.5F_{DAC}$.

Next, a further description will be given as to how to systematically select values of the ratio between r and n to achieve beneficial mappings of the rotation components.

Three examples will be considered. In the first example, it is assumed that the range of output-signal frequencies is 13.5 to 48.5 MHz and that the sampling rate FDAC is 832 Msamples/s. This corresponds to output-signal frequencies in a passband of the first Nyquist zone for 8x over-sampling. In the second example it will be assumed that the range of output-signal frequencies is 55.5 to 90.5 MHz with the same sampling rate of 832M samples/s. This corresponds to output-signal frequencies in a passband in the second Nyquist zone. In the third example, it will be assumed that the range of output-signal frequencies is 117.5 to 152.5 MHz with the same sampling rate. This corresponds to output-signal frequencies in a passband in the third Nyquist zone.

Figure 11A:
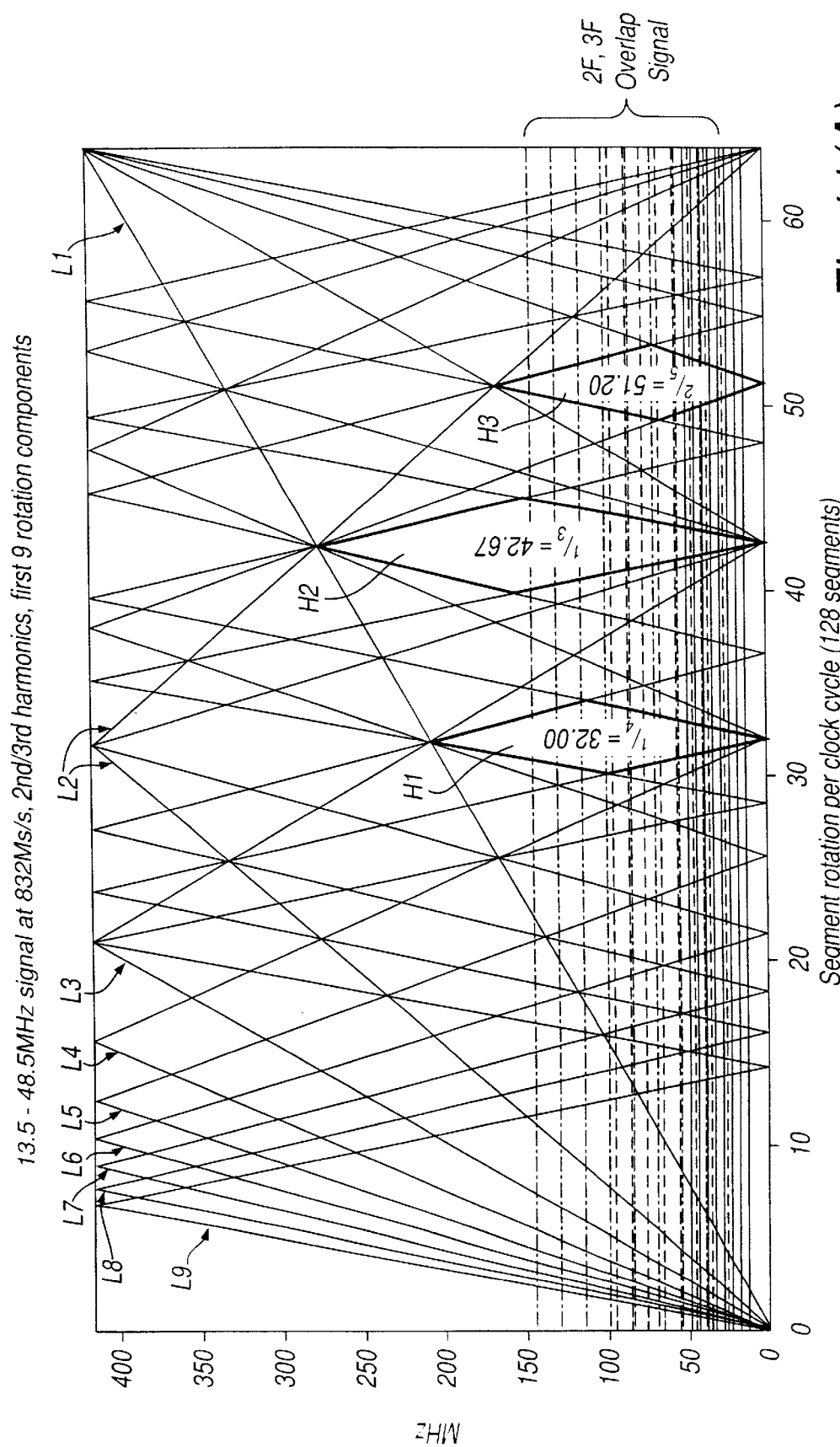
FIG. 11(A) shows a graph illustrating the mapping of rotation components in a first example in which the output-signal frequency range is in a passband in the first Nyquist zone.
Figure 11B:
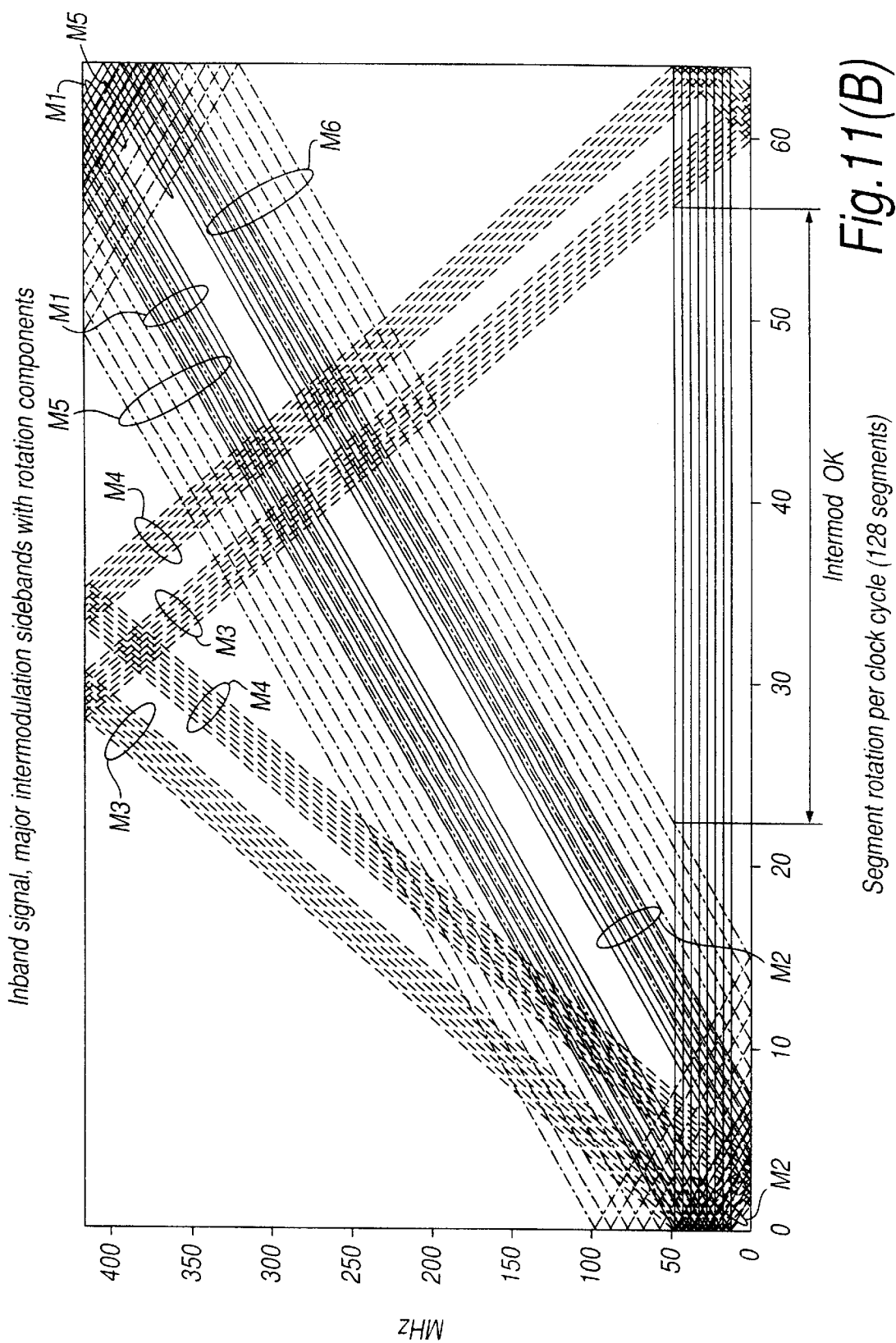
FIG. 11(B) shows a graph illustrating significant intermodulation sidebands in the first example.

FIGS. 11(A) and 11(B) are graphs for use in explaining how to choose a suitable r-value in the first example (first Nyquist zone case). FIG. 11(A) illustrates, for the first nine rotation components (which, as will be explained later, are the most significant components to be considered), the frequencies to which those components are mapped for different r-values. In all the present examples, it will be assumed that the n of segments is 128. The range of r-values on the horizontal axis in FIG. 11(A) is from 0 to 64, i.e. 0 to n/2.

A line L1 represents the frequencies to which the first rotation component is mapped for the different r values. As expected, the first-rotation-component frequency increases linearly as r increases to reach $F_{DAC}/2$ at r=n/2. A line L2 represents the frequencies to which the second rotation component is mapped as r varies. The second-rotation-component frequency increases linearly from 0 to $F_{DAC}/2$ at r=n/4, and then decreases linearly from that value to 0 again at r=n/2. Lines L3 to L9 represent respectively the mappings for the third to ninth rotation components.

FIG. 11(A) also shows as eight horizontal solid lines a set of eight evenly-spaced tones (frequencies) constituting the output signal. In the first example these 8 tones have the frequencies 13.5, 18.5, 23.5, 28.5, 33.5, 38.5, 43.5 and 48.5 MHz respectively. Also, the eight horizontal dashed lines in FIG. 11(A) denote respectively the second harmonics of the eight tones. These second harmonic frequencies are at double the respective frequencies of their corresponding tones. Similarly, the eight horizontal dot-dash lines in FIG. 11(A) represent the third harmonics of the eight tones, which are at frequencies three times those of their respective corresponding tones. It can be seen in FIG. 11(A) that the lower-frequency second and third harmonics are within the output-signal range of 13.5 to 48.5 MHz.

A first requirement for choosing a suitable r-value to achieve desired noise-shaping is that the significant rotation components should be mapped to frequencies away from the range of output-signal frequencies. Suitable r-values meeting this first requirement are contained in "holes" in the FIG. 11(A) graph where none of the lines L1 to L9 crosses any of the horizontal lines representing the tones within the desired output-signal frequency range. Three such "holes" H1, H2 and H3 are identified in FIG. 11(A). The first hole is centred on r=32, i.e. r=n/4. The second hole H2 is centred on r=42.67, i.e. r=n/3. The third hole H3 is centred on r=51.20, i.e. r=2n/5. There are other holes available in FIG. 11(A) but these three holes Hi to H3 are the largest and therefore the easiest to observe.

The second requirement for choosing a suitable r-value is that significant intermodulation products should also be as far away as possible from the output-signal frequency range. FIG. 11(B) is a graph illustrating the effects of major intermodulation sidebands with the rotation components in the first example. These sidebands result from intermodulation of the output signal with the rotation components. In FIG. 11(B) there are six sets of oblique lines M1 to M6. The two line sets M1 and M2 correspond respectively to the upper and lower first sidebands of the first rotation component. Similarly, the two line sets M3 and M4 correspond respectively to the upper and lower sidebands of the second rotation component. The two line sets M5 and M6 correspond respectively to the upper and lower second sidebands of the first rotation component. The above-mentioned sidebands are the most significant for noise-shaping purposes.

In FIG. 11(B) the eight tones of the output signal are also shown as respective horizontal solid lines. Suitable r-values from the intermodulation point of view are r values where output signal lines are not crossed by any of the intermodulation line sets M1 to M6. It can seen from FIG. 11(B) that the range of suitable r values is from approximately 22.4 to approximately 56.5 in the first example (baseband case).

Taking the results shown in the two graphs of FIG. 11(A) and FIG. 11(B) together, it an be seen that the r-values in the three holes H1, H2 and H3 in FIG. 11(A) are good values, compatible with keeping the significant intermodulation sidebands away from the output signal as is clear from FIG. 11(B). It will be appreciated, incidentally, that the value of r=51.2 is the value mentioned previously at which r/n=0.4.

Thus, FIGS. 11(A) and (B) indicate that in the first example suitable r values (when n=128) can be systematically selected as any of 32, 42.67 or 51.2.

Figure 12A:
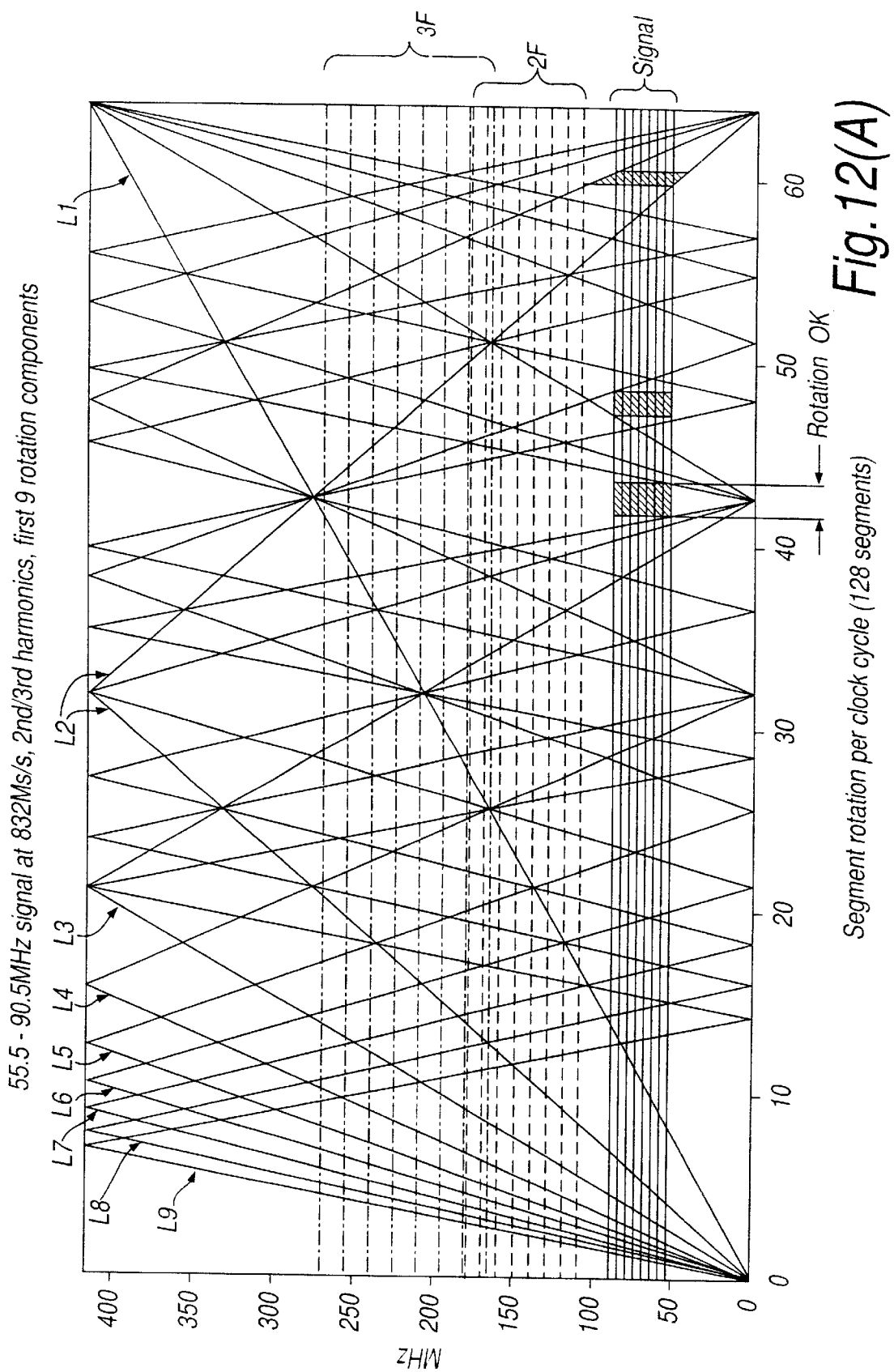
FIG. 12(A) shows a graph illustrating the mapping of rotation components in a second example in which the output-signal frequency range is in a passband in the second Nyquist zone.
Figure 12B:
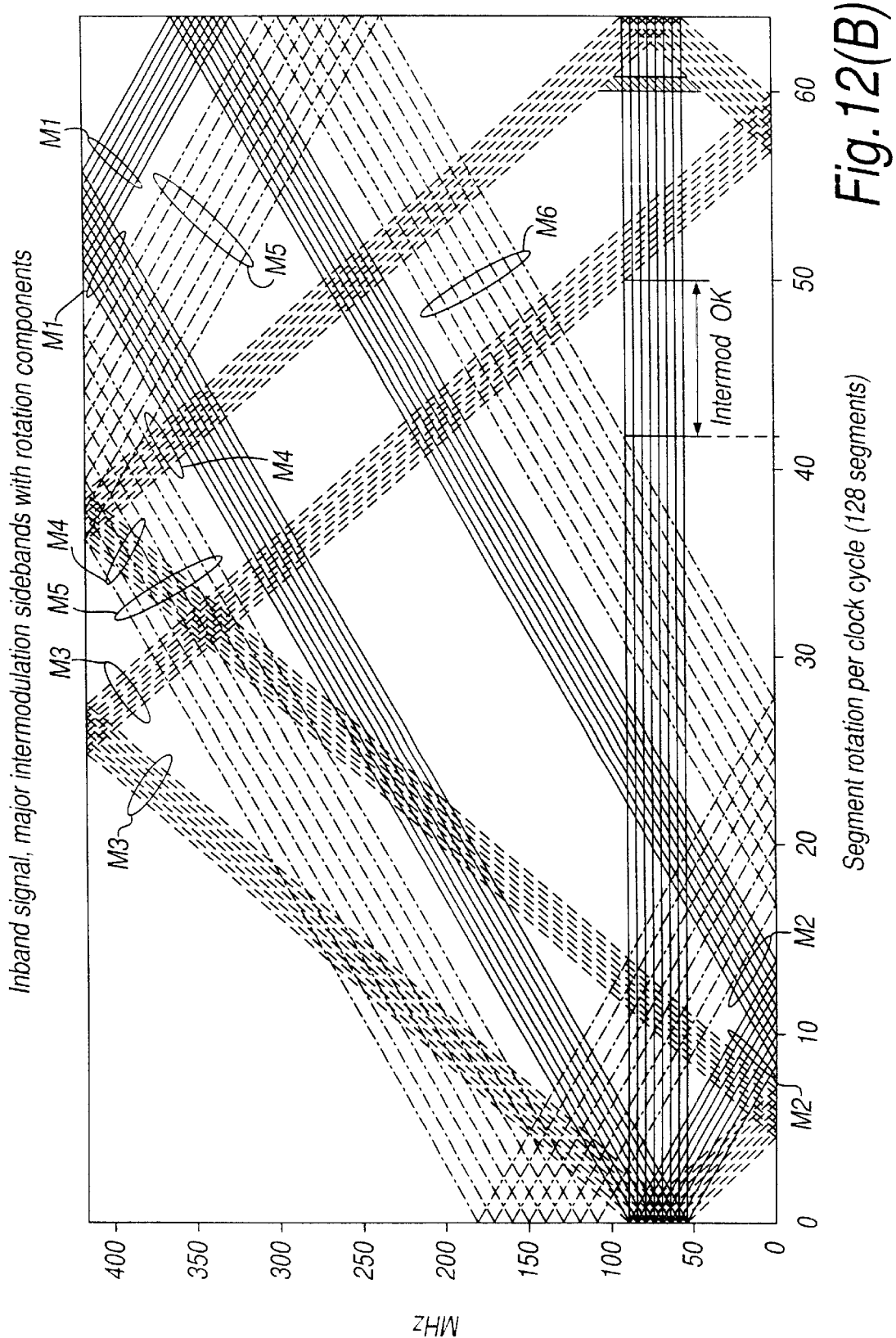
FIG. 12(B) shows a graph illustrating significant intermodulation sidebands in the second example.

FIGS. 12(A) and 12(B) are graphs corresponding respectively to FIGS. 11(A) and 11(B) but relate to the second example (passband in second Nyquist zone). In the second example, the tones have the frequencies 55.5, 60.5, 65.5, 70.5, 75.5, 80.5, 85.5 and 90.5 MHz respectively. In this case, holes bounded by the lines L1 to L9 exist in a similar way of FIG. 11(A). However, in FIG. 12(B) the range of suitable r-values from the intermodulation point of view is much more restricted, and there is one band from r=42 to r=50 and another band from r=56 to r=61. Taking the two graphs together, good choices for r-values in the second example are relatively hard to find. The best possibility is in a narrow range centred on r=42.67, i.e. r=n/3. Other possibilities are r=48 and r=60. In the latter case, however, it can be seen that the second rotation component (line L2) is very close in frequency to the lowest-frequency tone in the output signal. Keeping in mind that intermodulation occurs also between intermodulation products, it is desirable to maintain some clearance between each rotation component and the edges of the output-signal frequency band.

Figure 13A:
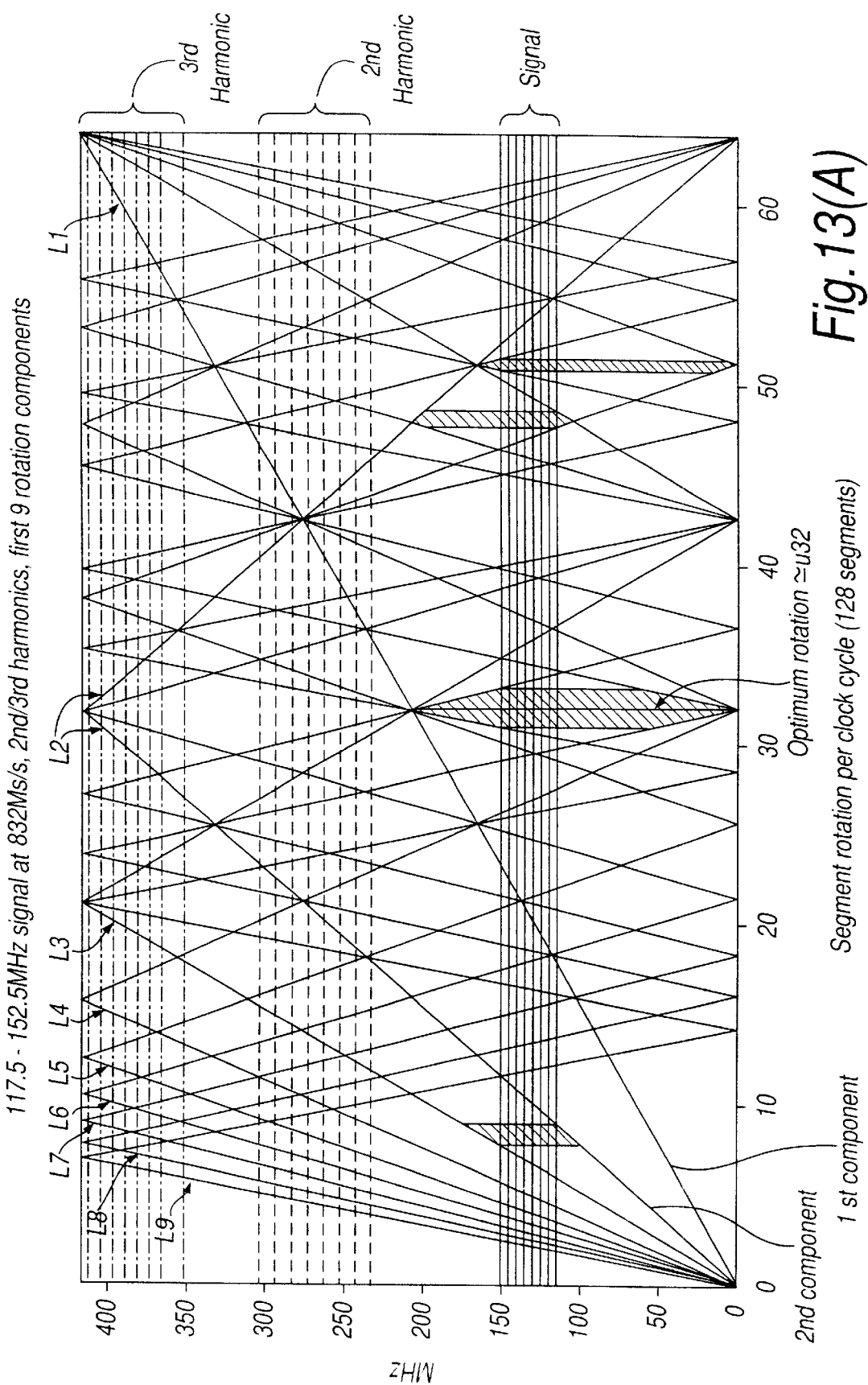
FIG. 13(A) shows a graph illustrating the mapping of rotation components in a third example in which the output-signal frequency range is in a passband in the third Nyquist zone.
Figure 13B:
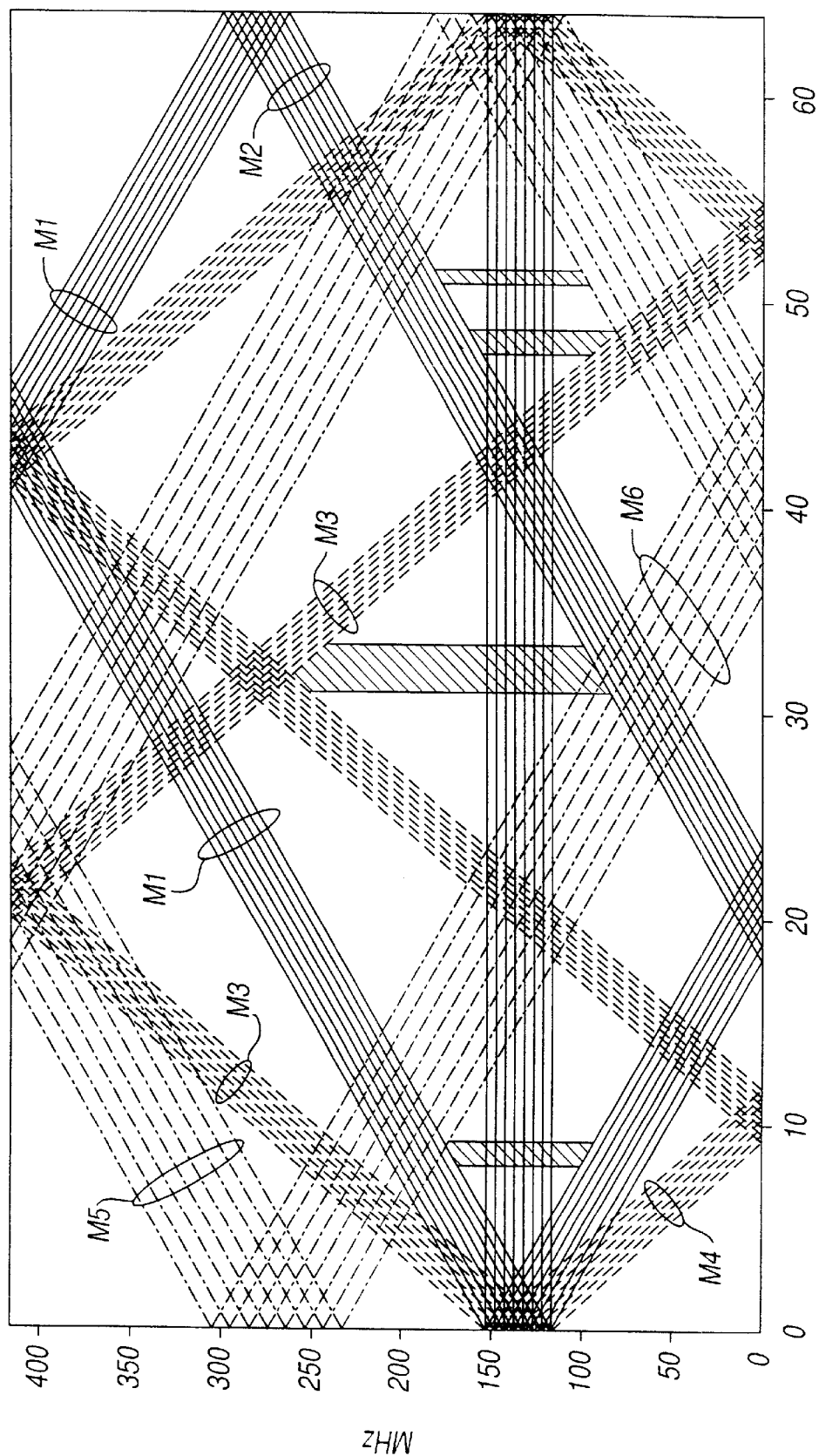
FIG. 13(B) shows a graph illustrating significant intermodulation sidebands in the third example.

FIGS. 13(A) and 13(B) are graphs corresponding respectively to FIGS. 11(A) and 11(B) for the third example (passband in the third Nyquist zone). In the third example, the tones have the frequencies 117.5, 122.5, 127.5, 132.5, 137.5, 142.5, 147.5 and 152.5 MHz respectively. In this case, there are again various available "holes" in the rotation component graph of FIG. 13(A) where no lines L1 to L9 cross the output-signal frequency lines. In FIG. 13(B) there are also three "holes" in the intermodulation graph. Considering the two graphs in combination, it can be seen that there are four good choices for r, namely r≈8, r≈32, r=48 and r=51.2, with r≈32 optimal, as its corresponding holes in both graphs are relatively expansive.

Incidentally, in all the graphs no spreading is used, i.e. the r-value is the same in all cycles. In practice, a small amount of spreading (e.g. 2) should be used (a large spread is disadvantageous as it tends to spread the rotation components into the desired output-signal frequency range). For example, random selection could be made between r=31 and r=32, giving an average r-value of 31.5.

After using the graphs to identify holes containing possible candidate r-values, the next step is to choose suitable MEAN and SPREAD values (FIG. 15) to achieve the best noise-shaping profile in the desired range of frequencies. This can be achieved by performing simulations whilst sweeping the identified regions with different MEAN and SPREAD values in the region.

Figure 14:
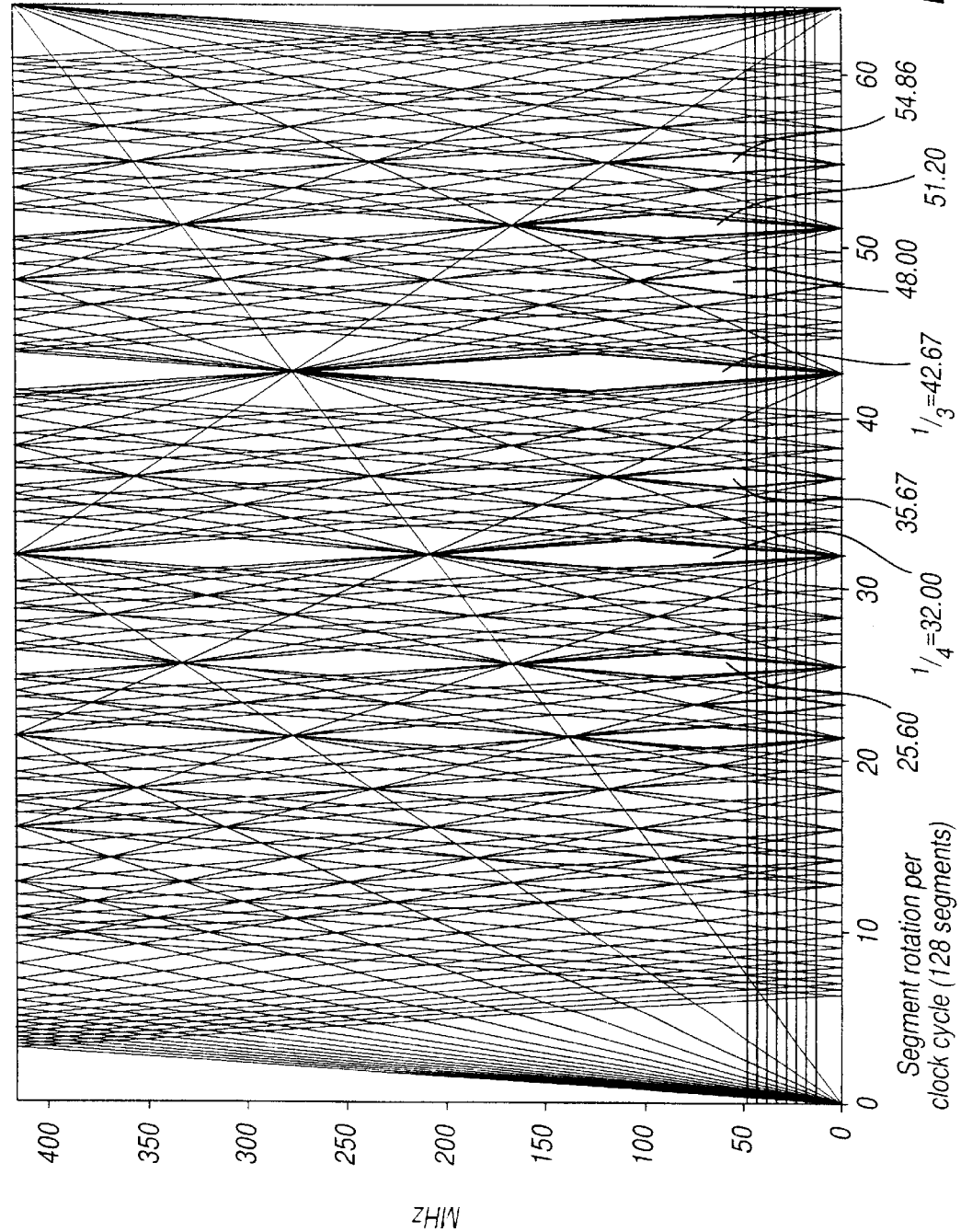
FIG. 14 is another graph corresponding to FIG. 11(A) but showing further higher-order rotation components.

Next, the first Nyquist zone will be considered in more detail with reference to FIGS. 14 and 15. The first example (passband from 13.5 to 48.5 MHz) and a fourth example (baseband from DC to 48.5 MHz) will be considered.

FIG. 14 extends the information contained in the graph of FIG. 11(A) from the first nine rotation components to the first twenty rotation components. From FIG. 14, it can be seen that the available "holes" correspond to the ratio r/n being particular fractions. For example, the holes H1 to H3 in FIG. 11(A) correspond respectively to the fractions ¼, ⅓ and ⅖. Other holes have corresponding fractions, such as ⅕, 2/7, 3/7, 3/8 etc. Thus, these fractions can be expected to provide possible good candidate r/n ratios. The table of FIG. 15 considers these fractions as candidate r/n ratios in more detail and gives some simulation results confirming the validity of the graph-based selections of r-values using FIGS. 11 to 13. Only fractions in the range from r/n=$^{22.4}/_{128}$ to r/n=$^{56.5}/_{128}$ were examined, in view of this being the range of the "hole" in the intermodulation graph of FIG. 11(B) for the first example.

In the FIG. 15 table, the first column gives the numerator NUM and denominator DEN of each candidate fraction for r/n. Column 2 indicates the r-value corresponding to the fraction in the case in which the number of segments n is 128. Column 3 indicates the frequency $F_{upper}$ of the rotation component having the lowest frequency (excluding DC). Column 4 indicates the frequencies to which the first few rotation components are mapped. Here the components up to the first DC component are indicated (up to a maximum of five components). Any rotation components that are mapped to DC are omitted. In fact, every DENth rotation component is mapped to DC. The frequencies specified in column 4 are expressed as a fraction of the sampling frequency $F_{DAC}$. The value of $F_{upper}$ in column 3 is the actual frequency of the lowest-value fraction in column 4, i.e. the component nearest to the upper end of the output-signal frequency range.

Columns 5 and 6 relate specifically to the fourth example (baseband case: 0 to 48.5 MHz) and columns 7 and 8 relate specifically to the first example (passband in first Nyquist zone: 13.5 to 48.5 MHz) and provide simulation results.

For each different candidate fractional value, a number (200) of simulations were performed, the input of the DAC in the simulations being eight evenly-spaced tones having the frequencies shown in FIGS. 11(A) and 13(A) and the sampling rate $F_{DAC}$ being 832 MHz.

In the simulations, the DAC transfer function was deliberately varied from one run to the next so as to factor into the simulation the expected inherent transfer-function variability from one DAC device to the next resulting from manufacturing.

In each run the highest (worst-case) noise level in any single 100 KHz channel over the band (0–48.5 MHz for the fourth example; 13.5–48.5 MHz for the first example) was determined. The mean of those worst-case noise levels (mean) over the different runs was calculated (columns 5 and 7) as was the standard deviation (a) of those worst-case noise levels over those runs (columns 6 and 8). The DAC transfer function variability leads to the standard deviation in the noise performance. As is clear from the FIG. 15 table, both the mean and a vary for different fractional values of r/n. When random rotation is carried out (final line of the table), the mean noise and standard deviation figures are 114.4 dB and 3.2 dB respectively. Random rotation has the effect of disabling any noise shaping, i.e. producing wideband noise having a completely-flat noise floor with no noise peaks at all. In the fourth example (baseband case) the mean and standard deviation figures when rotation is carried out vary quite widely, from significantly worse than the "random rotation" case to significantly better than it. In the first example (passband case), the mean and standard deviation figures are less variable and are all better than the "random rotation" case.

Column 9 indicates the difference in mean worst-case noise level in the baseband case compared to the passband case. It can be seen that when DEN is relatively small (9 or less), the baseband noise performance is significantly lower than the passband noise performance. This is because highly-significant lower-order rotation components are mapped to DC (in the output-signal frequency range in the baseband case) when DEN is small. On the other hand, when DEN is 10 or higher, no lower-order rotation component (order<DEN) maps to DC, so as DEN increases the baseband performance improves and the difference in the mean noise levels between the baseband and passband cases becomes small (0.5 dB or less). As DEN increases further, however, $F_{upper}$ falls, bringing the lowest-frequency rotation component closer to the upper end of the output-signal range for both the baseband and passband cases. The effect of this depends on the order of that lowest-frequency component. If it is a higher-order component its effect is less damaging than if it is a lower-order component. For example, when the entries in column 4 are compared for the fractions 2/11, 3/11 and 4/11, it can be observed that the lowest-frequency component (1/11 $F_{DAC}$ or 75.6 MHz in each case) is the third component for 4/11, the fourth component for 3/11 and the fifth component for 2/11. Thus, 2/11 would be expected to be a better choice than 3/11 or 4/11 and the standard deviation figures for the baseband case (column 6) bear this out. Generally, it is desirable in the baseband case to choose a fraction which makes the lowest-frequency rotation component the highest-order possible (i.e. as far to the right in column 4). It might be expected, for example, that $F_{upper}$<62 MHz would cause problems in this example for some systems, for the same reason that DC components cause the baseband performance to be worse than the passband performance (62–48.5 (margin above band) =13.5–0 band (margin below band). Such a margin above is desirable as any spreading will inevitably bring the noise component at $F_{upper}$ nearer to the upper limit of the output-signal frequency range. Incidentally, it is because higher-order rotation components (order<9) do not materially affect the noise performance in the first example case that in the graph of FIG. 11(A) it is acceptable to plot only the lines L1 to L9 for the first 9 rotation components.

The best overall noise figures are obtained for the first example (baseband) with r/n=$^{3}/_{14}$, and for the third example (passband) with r/n=$^{2}/_{7}$. In the passband case, $^{5}/_{13}$ is also a good choice. Not only should the mean noise performance be good, but also should the standard deviation of the noise performance, which is a measure of the variability of the noise performance from one device to another. For example, in a passband case in which noise at 64 MHz can be tolerated, $^{5}/_{13}$ could be chosen. If noise at 64 MHz cannot be tolerated, on the other hand, then $^{2}/_{7}$ should be chosen. In a cellular communications system, for example, the DAC could be used to generate transmit signals in a transmit band from (say) 13.5 MHz to 48.5 MHz. In this case, a receive band of (say) 53.5 MHz to 88.5 MHz could be used for the receive signals. This means the system (not the DAC) will be sensitive to noise in the receive band, so placing noise components at frequencies in this band will be a potential problem. $F_{upper}$ for the fraction $^{2}/_{7}$ is better at 118.8 MHz, therefore.

The final two columns 10 and 11 in the FIG. 15 table present, for both cases, a noise performance figure (mean-2σ) produced by subtracting twice the standard deviation o from the mean value. Thus, each column 10 value is produced by subtracting from the column 5 value twice the column 6 value. Similarly, each column 11 value is produced by subtracting from the column 7 value twice the column 8 value. The best column 10 figures are obtained when r/n=$^{5}/_{13}$ or $^{3}/_{14}$. Similarly, the best column 11 figures are obtained when r/n=$^{2}/_{7}$ or $^{5}/_{13}$.

The column 10 and 11 values are helpful to a manufacturer of devices in assessing a trade-off between device yield and guaranteed minimum device performance. Based on well-known device yield curves, it is known, for example, that if a guaranteed minimum performance figure is quoted based on a "mean-2σ" figure such as the column 10 and 11 figures, approximately 95% of manufactured devices will meet or exceed the guaranteed performance, i.e. the yield will be 95%.

If, instead of using a "mean-2σ" figure, the manufacturer quotes the guaranteed performance based on a more modest "mean-3σ" figure, the yield will increase slightly, for example to 98.5%, making the unit cost slightly lower, but of course the quoted performance will also be lower, making the device less attractive to customers. If the manufacturer quotes the guaranteed performance based on a more demanding "mean-σ" figure, the yield will drop dramatically, for example to 50%, doubling the unit cost, but the quoted performance will be higher, making the device more attractive to customers. The "mean-2σ" figure is a sensible trade-off in the present case, in that it gives an attractive performance level for customers (e.g. 120.4 dB for $r/n=5/13$) whilst keeping the yield desirably high so that the unit cost is economic.

At the last line of columns 10 and 11 the comparable "mean-2σ" figure (108.0 dB) for the DAC when random rotation is carried out can be seen. The improvements achieved by the best candidate fractions in these examples are some 12 dB, which is equivalent to an extra 2 bits in DAC precision, a very significant improvement.

Accordingly, using analysis based on graphs such as those shown in FIGS. 11 to 14, and the statistical information collected in the table of FIG. 15, it is possible to systematically select good r/n values for use in any particular situation. The graphs can be produced by a computer operating according to computer program, and the "holes" can be identified and matched up either manually (using print-outs or on-screen displays) or automatically by the computer program.

It will be appreciated that, although the embodiments described above have used different r values in different conversion cycles, it is not necessary to do this in all cases. A fixed r value can be used in embodiments in which the rotation components and intermodulation products are all mapped out of the desired band of interest by the rotation with the fixed r-value.

It will also be appreciated that, although the segment rotation section described with reference to FIG. 10 employs a so-called "barrel shifters" architecture, any other suitable constructions and architectures of segment rotation section can be used in embodiments of the present invention. For example a butterfly shuffler architecture or tree structure could be employed. Alternatively, a different architecture to that shown in FIG. 5 can be employed which avoids the need for such a barrel shifter, as explained below.

In the embodiment described above with reference to FIGS. 5 to 10, the binary input word D1–Dm is first decoded globally by the binary-thermometer decoder 6 to derive thermometer-coded input signals IT1–ITn. These thermometer-coded input signals IT1–ITn are then rotated globally by a rotation amount r by the segment rotation section 22 to produce a set of rotated output signals OT1–OTn, which serve as the inputs T1–Tn to the differential switches $4_1$ to $4_n$ provided respectively in the n segments.

Figure 16:
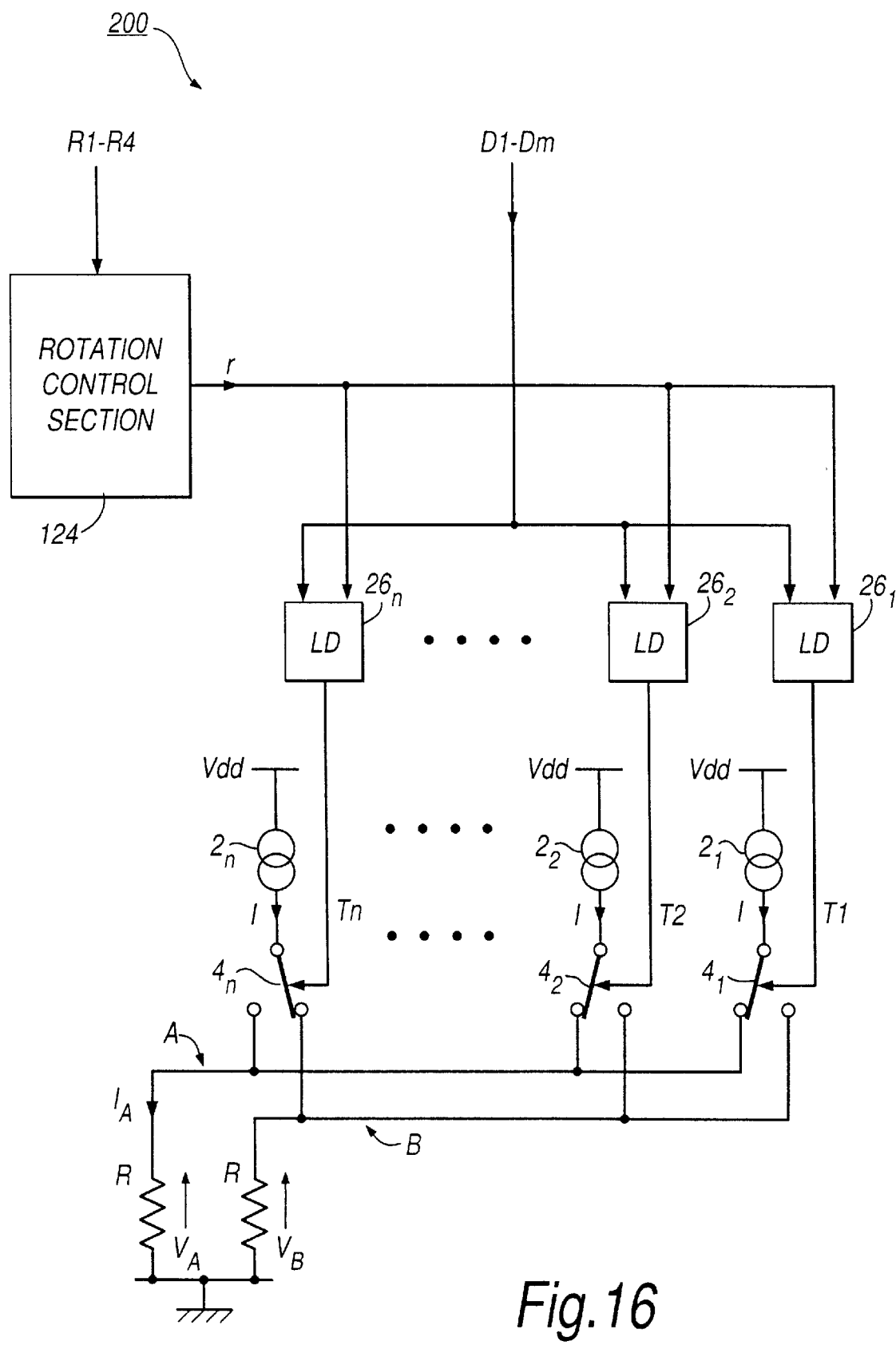
FIG. 16 shows parts of a DAC according to another embodiment of the present invention.

FIG. 16 shows an alternative arrangement of a DAC 200 embodying the present invention. Parts of the FIG. 16 DAC which are the same as, or correspond closely to, parts of the FIG. 5 DAC discussed hereinbefore are denoted by the same reference numerals, and a description of those parts is omitted.

In the FIG. 16 DAC each segment has a local decoder 26 in addition to the constant current source 2 and switch 4 described above with reference to FIG. 5. The switch 4 in each segment is controlled by an individually-corresponding thermometer-coded signal T supplied thereto from the local decoder 26.

The FIG. 16 DAC includes a rotation control section 124 generally similar to the rotation control section 24 of FIG. 5, but the binary-thermometer decoder 6 and the segment rotation section 22 of the FIG. 5 embodiment are not necessary in this embodiment. The local decoder 26 in each segment receives at a first input the rotation amount r supplied from the rotation section 124 and at a second input the binary input word D1–Dm.

Figure 17:
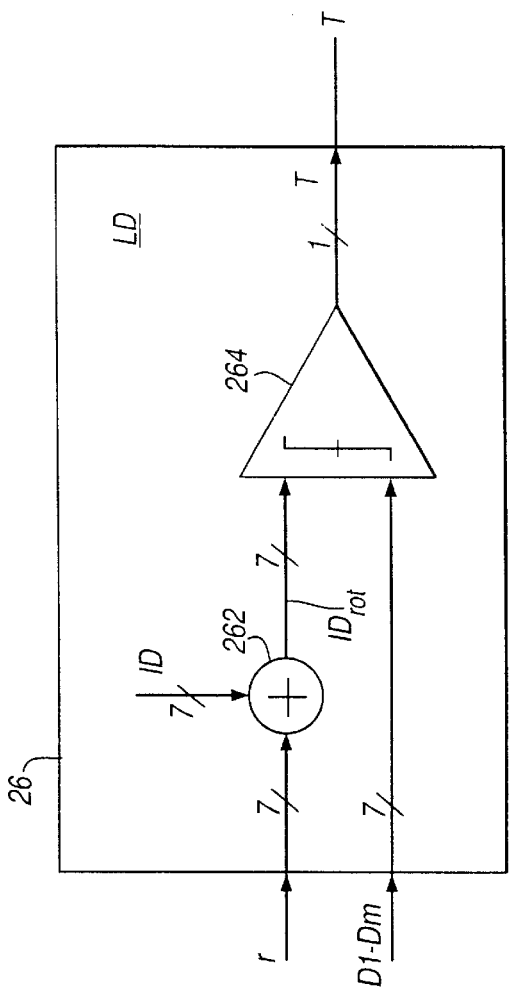
FIG. 17 is a block diagram showing an example of the constitution of a local decoder of the FIG. 16 DAC.

The circuitry contained within the local decoders 26 will be described with reference to FIG. 17. Each local decoder comprises an adder 262 and a comparator 264. The adder receives at one input the rotation amount r applied to the first input of the local decoder and at another input a pre-assigned segment ID which is unique to that segment. The comparator 264 receives at its two inputs the binary input word D1–Dm applied to the second input of the local decoder and an output $ID_{rot}$ of the adder 262, and outputs a thermometer-coded signal T for its segment.

Operation of the DAC 200 shown in FIGS. 16 and 17 will now be described. In this example it will be assumed that the number n of segments is 128 and that a value of the rotation amount r (r<n) is produced by the rotation control circuitry 124 in each cycle of the circuitry as described above with reference to FIG. 5. In this embodiment, since there are 128 segments, the binary input word D1–Dm is 7 bits wide, as are the rotation amount r and the local segment ID. Each of the 128 segments is assigned a unique ID chosen from one of the values 0 to 127. The ID is, for example, hard-wired within the local decoder.

As can be seen from a comparison of FIG. 5 with that of FIG. 16, in this embodiment both the decoding of the binary input word D1–Dm into thermometer coded signals T1–Tn, and the rotation itself, are not done "globally" (by a centralised binary-to-thermometer decoder such as the decoder 6 in FIG. 5) but instead are performed locally within each of the n segments. The rotation amount r is still produced in common for all segments by the rotation control section 124.

In the local decoder 26, the rotation amount r is added to the local segment ID by the adder 262. Any carry generated by the adder is ignored so that the result $ID_{rot}$ of the addition "wraps around" to 0 after exceeding 127 (i.e. the adder is mod-128). The result $ID_{rot}$ is then compared, by the comparator 264, with the binary input word D1–Dm to determine the state of the differential switch 4 for that segment. In this example, if the binary input word is greater than the result of the addition, then the output of the comparator (T) is high (1).

When such a greater-than comparator 264 is used in each of the 128 segments as described above, one of the segments (the segment for which $ID_{rot}=127$) is always in the OFF state (T=0) in any cycle, since the binary input word can never be greater than 127. To maintain a zero offset (taking into account the differential current-switching nature of the switching circuitry), an extra "dummy" segment is included which is maintained to be always in the ON state (T=1). This is more convenient than using only 127 segments since a mod-127 adder would then be required in each segment in place of the simple mod-128 adder. If a greater-than-or-equal comparison were instead performed by the comparator, then one of the segments (the segment for which $ID_{rot}=0$) would always be in the ON state (T=1), so that the extra "dummy" segment would instead need to be maintained in the OFF state (T=0) to achieve a zero offset.

As mentioned above, the segments have IDs in the range from 0 to 127. Therefore, assuming for the moment that the rotation amount r is 0, each segment whose ID is less than the binary input word will have its thermometer-coded signal T set to 1. All other segments will have their thermometer-coded signals set to 0. In this embodiment, therefore, the set of comparators 264 performs the same basic function as the binary-thermometer decoder 6 of the FIG. 5 embodiment.

Adding a non-zero rotation amount r to each of the segment IDs in each cycle has the effect of rotating the segment IDs by the amount r, so that in the present cycle a different set of segments is activated, for the same binary input word, compared to the set activated in the preceding cycle. The set of adders 262 therefore performs the same basic function as the segment rotation section 22 of FIG. 5. One advantage of the FIG. 1G embodiment over the FIG. 5 embodiment is that it avoids the need for a barrel shifter, which can be cumbersome when the number of segments is large.

Incidentally, instead of adding the segment's ID to the rotation amount r it would be possible to subtract the ID from the rotation amount r to achieve the same effect. Subtraction can be achieved, for example, by providing the segment ID in twos-complement form and adding it to the rotation amount r.

Figure 18:
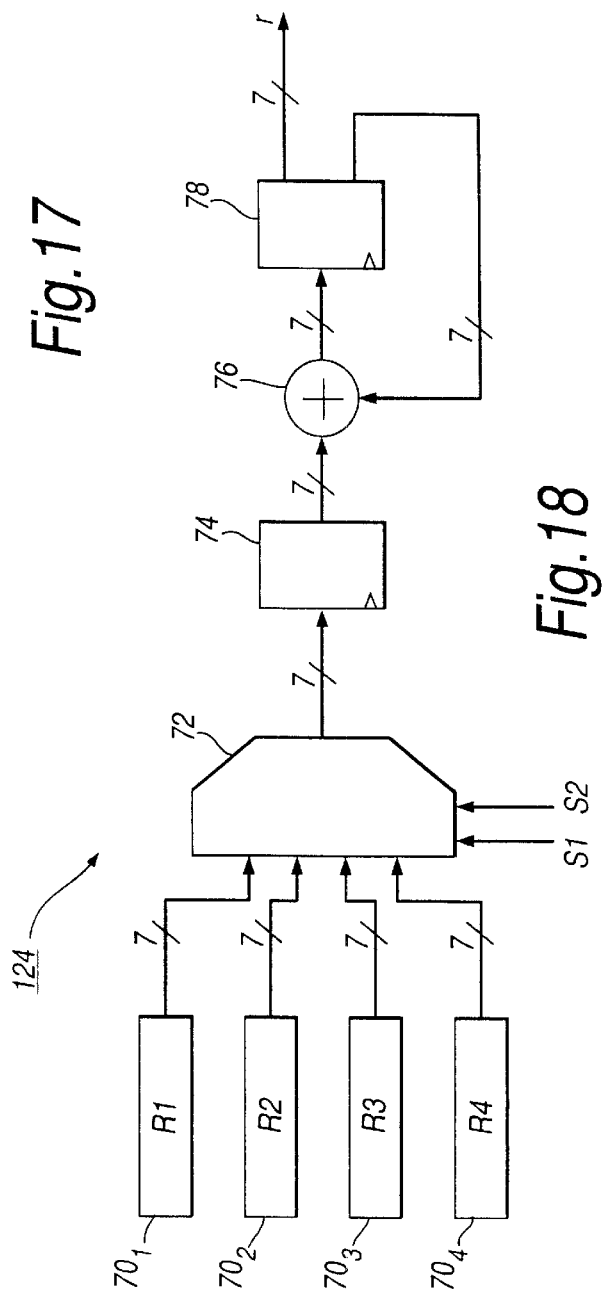
FIG. 18 is a block diagram showing an example of the constitution of a rotation control section of the FIG. 16 DAC.

FIG. 18 shows one possible implementation of the rotation control section 124 in FIG. 16; this is an alternative implementation to that shown in FIG. 9 and can be used in the FIG. 5 DAC as well. The rotation control circuitry of FIG. 9 comprises four 7-bit registers $70_1$ to $70_4$, a multiplexer 72, a first latch 74, an adder 76 and a second latch 78. The multiplexer 72 has four data inputs, connected for receiving respective outputs R1–R4 of the four registers $70_1$ to $70_4$, and two selection inputs, connected for receiving two selection signals S1 and S2. The multiplexer 72 selects one of its four data inputs R1–R4 in dependence upon the selection signals S1 and S2. The output of the multiplexer 74 (i.e. the selected one of the data inputs R1–R4) is provided, via the first latch 74, as one input to the adder 76. The output of the adder is provided to the input of the second latch 78. The output of the second latch 78 provides the rotation amount r, which is also fed back to act as another input to the adder 76.

In operation of the FIG. 18 rotation control circuitry, four predetermined possible values R1–R4 for the rotation amount r are loaded respectively into the four registers $70_1$ to $70_4$. The values R1–R4 may all be different, but it is also possible for two or more values to be the same. One of these possible values is selected at random in each conversion cycle by the multiplexer 72 by supplying two pseudo-random bits as the multiplexer selection signals S1 and S2. Each possible value is selected with the same frequency on average in this embodiment. The possible values are chosen as described above to give the desired mean and spread. For example, using values of 49, 51, 52 and 53 would give a mean of 51.25 and a spread of 4. The value selected at random is then accumulated by the adder 76 and second latch 78 in a similar way to the second adder 54 and latch 58 of FIG. 9 to provide the rotation amount r at the output of the rotation control circuitry.

In the FIG. 18 example, four registers $70_1$ to $70_4$ are provided. However, it will be appreciated that any suitable number of registers can be used. Also it will be appreciated that the register values R1 to R4 can either be pre-set or can be loaded into the registers dynamically according to need.

Incidentally, if very high speed operation is required the local decoder for each segment may be provided with two (or more) circuit portions each performing the same basic addition and comparison operations for different bits of the parameters (the segment ID, the rotation amount r and the binary input word D1–Dm). For example, a first circuit portion may operate on the most significant bits in response to each rising edge of a clock signal, and a second circuit portion may operate on the least significant old bits in response to each falling edge of the clock signal. The two or more circuit portions may also operate on a pipelined basis, if desired.

Figure 19:
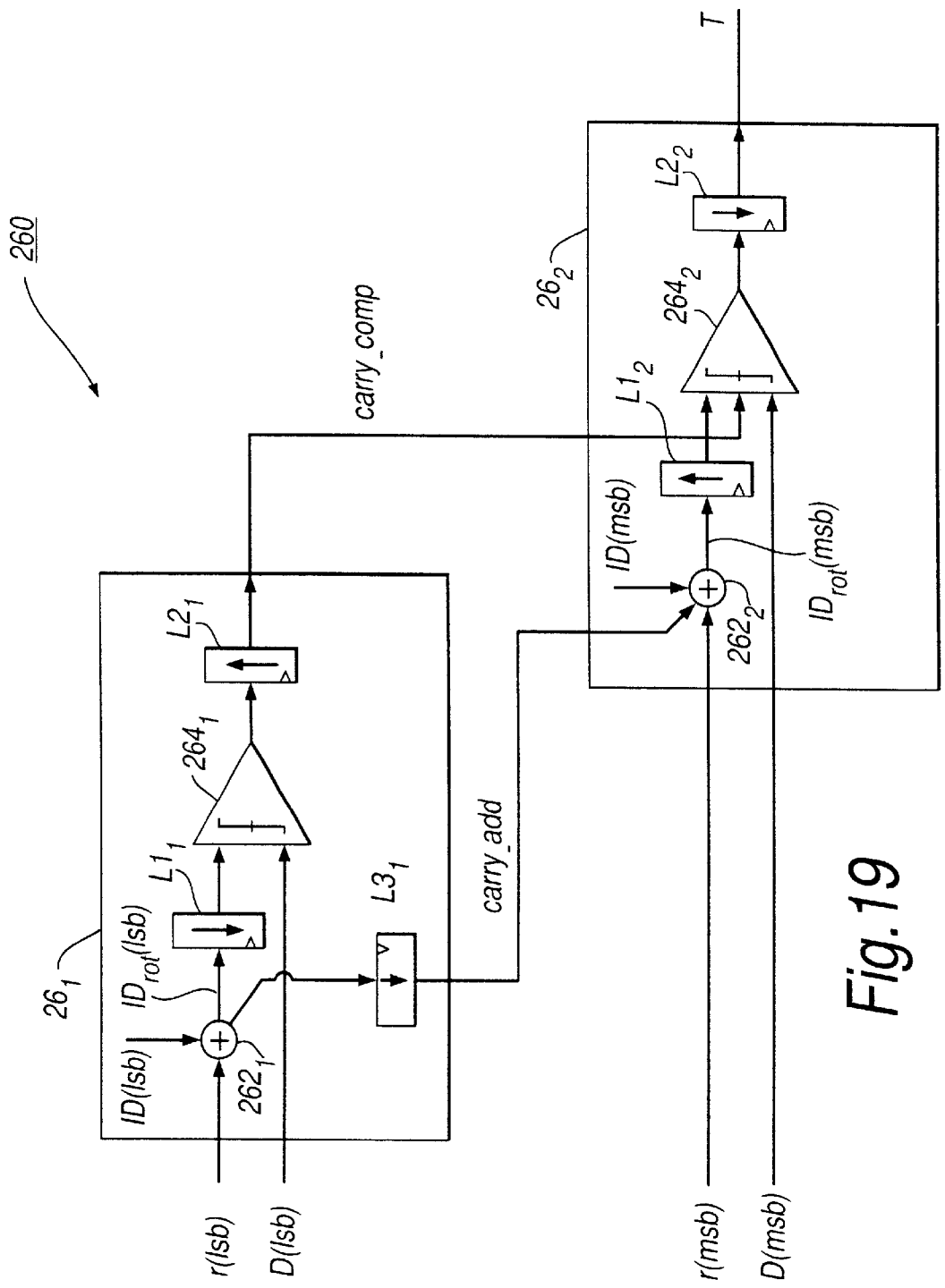
FIG. 19 is a block diagram showing an alternative implementation of the FIG. 17 local decoder.

One such example of a pipelined local decoder will be described with reference to FIGS. 19 and 20. FIG. 19 shows local decoder circuitry 260 which comprises a first circuit portion $26_1$ and a second circuit portion $26_2$. Each of the circuit portions $26_1$ and $26_2$ is generally similar to the single local decoder 26 described above with reference to FIG. 17, so further detailed description of the circuit portions $26_1$ and $26_2$ will be omitted here.

In this example, the operations performed by the local decoder 260 are split into operations on the least significant bits, performed by the first circuit portion $26_1$, and operations on the most significant bits, performed by the second circuit portion $26_2$. The first circuit portion $26_1$ makes use only of the least significant bits r(lsb) of the rotation amount r, the least significant bits D(lsb) of the binary input word D1–Dm, and the least significant bits ID(lsb) of the local segment ID. The second circuit portion $26_2$ makes use of the most significant bits r(msb) of the rotation amount r, the most significant bits D(msb) of the binary input word D1–Dm, and the most significant bits ID(msb) of the local segment ID. A carry bit "carry_add" is also required to be communicated from the least significant bit adder $262_1$ to the most significant bit adder $262_2$, and a carry bit "carry_comp" is required to be communicated from the least significant bit comparator 264, to the most significant bit comparator $264_2$, as shown in FIG. 19. Edge-triggered latches $L1_1$, $L2_1$, $L3_1$, $L1_2$ and $L2_2$ are included to control timing as will now be described with reference to FIG. 20.

Commencing on clock edge A, the first adder $262_1$ adds the least significant bits r(lsb) and ID(lsb) of the rotation amount r and the segment ID. The result $ID_{rot}$(lsb) and carry (carry_add) of this addition are latched on the falling clock edge B by latches $L1_1$ and $L3_1$ respectively. At this point, the second adder begins adding the most significant bits r(msb) and ID(msb) of the rotation amount r and the segment ID (taking account of the carry_add bit passed from the first circuitry portion $26_1$) at the same time that the first comparator 264, is comparing the latched result $ID_{rot}$(lsb) of the first addition with the least significant data bits D(lsb). The results of the second addition and first comparison are then latched by latches $L1_2$ and $L2_1$ respectively on the rising clock edge C. At this point the first circuit portion $26_1$ can begin operations on the next conversion cycle data whilst the second comparator $264_2$ completes operations on the previous conversion cycle.

Figure 20:
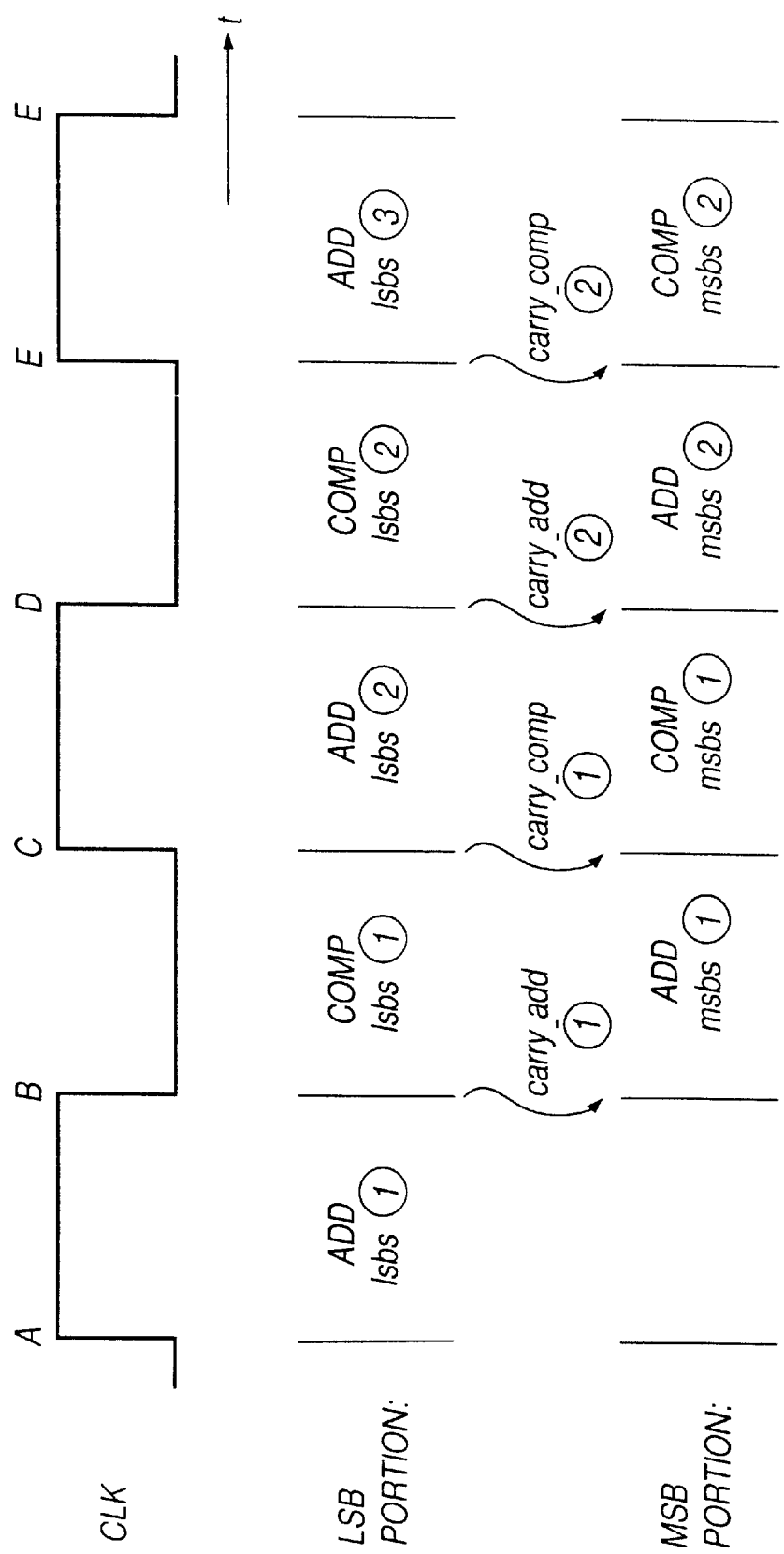
FIG. 20 is a timing diagram for use in explaining the operation of the FIG. 19 local decoder circuitry.

The FIGS. 19 and 20 embodiment splits the addition operation into two sub-operations "ADD lsbs" and "ADD msbs". Each of these sub-operations involves less bits than if the operation were to be carried out for all bits of r and ID, which makes it possible to complete the sub-operations on the lsbs within half a cycle even at high cycle rates. The same is true for the comparison operation which is also split into two smaller sub-operations "COMP lsbs" and "COMP msbs". As is clear from FIG. 20 in this embodiment "ADD lsbs" overlaps with "COMP msbs" and "ADD msbs" overlaps with "COMP lsbs".

In this way the operations performed by the local decoder 260 are pipelined, with operations from one conversion cycle overlapping with operations from an adjacent cycle.

Another advantage gained by splitting the local decoder into two circuit portions $26_1$ and $26_2$ as described with reference to FIGS. 19 and 20, is that the first circuit portion $26_1$, operating on the least significant bits (lsbs), can be shared between those segments whose segment IDs share the same bit pattern in their least significant bits.

For example, taking an example of 128 segments treated as 8 "groups", each with 16 "members" (the members of each group all have the same ID in the lsbs), the first group (with lsb ID=000) comprises segments 0, 8, 16, . . . , 120, the second group (with lsb ID=001) comprises segments 1, 9, 17, . . . , 121, and so on up to the eighth group (with lsb ID =111) which comprises segments 7, 15, 23, . . . , 127. Only one lsb local decoder circuit portion is needed per group (each member has its own msb local decoder circuit portion) and the above-described "carry_add" and "carry_comp" signals are routed to all members of the group.

This approach can save about 50% of the logic (which equates to gate count, power and area) compared to the non-split local decoder described above with reference to FIG. 17. With 8 groups of 16 segments (using a split of 3 lsbs and 4 msbs), the gate count is reduced from 8*(16*7N)= 896N to 8*(3N+16*4N)=536N which is 60% of the original (40% saving).

The saving would be even bigger with a larger number of smaller groups (e.g. 16 groups of 8, from 16*(8*7N)=896N to 16*(4N+8*3N)=448N which is a 50% saving), but there may be other design considerations to take into account which would make the use of smaller groups less attractive.

Although the present invention has been described in relation to DACs, it will be understood by those skilled in the art that the present invention is applicable to any type of mixed-signal circuitry which has a segmented architecture. For example, the present invention can be applied to analog-to-digital converters, programmable current generators, and to mixers that have a segmented architecture.

The pipelined rotation circuitry described above with reference to FIGS. 19 and 20 has more general applicability than in mixed-signal circuitry. For example, in another embodiment digital-only circuitry is required to produce a set of digital signals which are controlled in thermometer-coded fashion according to an applied control signal, as well as rotated according to a rotation amount. In this case the digital circuitry has a plurality of signal generating circuits, each including the FIG. 19 rotation circuitry for producing one of the digital signals of the set.

What is claimed is:

1. Mixed-signal circuitry, comprising digital circuitry and analog circuitry, operative to perform a series of operation cycles, wherein:

said analog circuitry has a plurality of circuitry segments which together produce an output signal having a frequency in a predetermined desired range of frequencies; and the digital circuitry comprises:

digital signal generating circuitry operable in each said cycle to generate a set of digital signals for application to respective ones of said segments;

rotating circuitry operable to rotate by r segments the digital signals applied to the segments in each cycle as compared to those applied in the preceding cycle, where r is a rotation amount for the cycle concerned; and rotation control circuitry which sets said rotation amount r for each said cycle such that one or more rotation components, being frequency components present in a frequency spectrum of said output signal as a result of said rotation, are mapped to one or more preselected frequencies or preselected narrow bands of frequencies outside said predetermined desired range.

2. Circuitry as claimed in claim 1, wherein said rotation control circuitry sets said rotation amount r for each said cycle such that substantially all of the rotation components are mapped to said one or more preselected frequencies or preselected narrow bands of frequencies outside said predetermined desired range.

3. Circuitry as claimed in claim 1, wherein said rotation control circuitry sets said rotation amount r for each said cycle so as to minimise a number of lower-order such rotation components within said predetermined desired range.

4. Circuitry as claimed in claim 1, wherein said rotation control circuitry sets said rotation amount r for each said cycle so as to maximise an amount by which each lower-order such rotation component is outside said predetermined desired range.

5. Circuitry as claimed in claim 1, wherein said rotation control circuitry sets said rotation amount r for each said cycle such that an average value of the rotation amount r is equal or close to 0.4n, where n is the number of said segments.

6. Circuitry as claimed in claim 1, wherein said rotation control circuitry sets said rotation amount r for each said cycle such that an average value of said Herotation amount r is equal or close to 0.5n, where n is the number of said segments.

7. Circuitry as claimed in claim 1, wherein said rotation control circuitry sets said rotation amount r for each said cycle such that an average value of said rotation amount r is less than 1.

8. Circuitry as claimed in claim 1, wherein said rotation control circuitry is operable to set different rotation amounts r for different said cycles.

9. Circuitry as claimed in claim 8, wherein said rotation control circuitry comprises spreading circuitry operable to spread the rotation amounts for different cycles by selecting them from amongst a plurality of predetermined different possible values.

10. Circuitry as claimed in claim 9, wherein said predetermined different possible values of said plurality are integer values, and the spreading of said rotation amounts is such that an average value of said rotation amounts over a succession of said cycles is a non-integer value.

11. Circuitry as claimed in claim 9, wherein said spreading circuitry makes such selection on a random or pseudo-random basis.

12. Circuitry as claimed in claim 9, wherein said predetermined different possible values employed by said spreading circuitry are selected so as to improve a noise distribution in said predetermined desired range.

13. Circuitry as claimed in claim 9, wherein each of said predetermined different possible values is a value of rotation amount for which the lowest-order rotation components, resulting from rotation by that value individually, are all mapped outside said predetermined desired range.

14. Circuitry as claimed in claim 9, wherein each of said predetermined different possible values is a value of rotation amount for which any rotation components resulting from rotation by that value individually that are mapped into said predetermined desired range are higher-order rotation components.

15. Circuitry as claimed in claim 10, wherein said integer values are consecutive values nearest to said average value.

16. Circuitry as claimed in claim 1, wherein said rotation control circuitry sets said rotation amount r for each said cycle such that an average value of the ratio r/n is equal or close to a predetermined fraction selected from the following group of fractions: $1/3$, $1/4$, $1/5$, $2/5$, $2/7$, $3/7$, $3/8$, $2/9$, $3/10$, $2/11$, $3/11$, $4/11$, $5/12$, $3/13$, $4/13$, $5/13$, $3/14$ and $4/15$.

17. Circuitry as claimed in claim 16, wherein said predetermined desired range is in a baseband, and said selected fraction has a denominator of 7 or more, preferably 10 or more.

18. Circuitry as claimed in claim 16, wherein said predetermined desired range is in a baseband, and said selected fraction is one of $2/11$, $5/12$, $3/13$, $5/13$ and $3/14$.

19. Circuitry as claimed in claim 16, wherein said predetermined desired range is in a passband in a first Nyquist zone, and said selected fraction is one of $2/7$, $5/12$, $5/13$ and $3/14$.

20. Circuitry as claimed in claim 1, wherein said predetermined desired range is in a baseband, and said rotation control circuitry sets said rotation amount r for each said cycle such that an average value of the ratio r/n is in the range from $20/128$ to $60/128$.

21. Circuitry as claimed in claim 1, wherein said predetermined desired range is in a passband of the second Nyquist zone, and said rotation control circuitry sets said rotation amount r for each said cycle such that an average value of the ratio r/n is equal or close to $1/3$, $48/128$ or $60/128$.

22. Circuitry as claimed in claim 1, wherein said predetermined desired range is in a passband of the third Nyquist zone, and said rotation control circuitry sets said rotation amount r for each said cycle such that an average value of the ratio r/n is close to $8/128$, $32/128$, $48/128$ or $51.2/128$, preferably close to $32/128$.

23. Circuitry as claimed in claim 1, wherein said rotating circuitry and said digital signal generating circuitry together comprise:
- ID rotating circuitry operable in each cycle to rotate respective IDs of the segments by said rotation amount r; and
- decision circuitry operable to generate said digital signal for each segment in dependence upon a comparison of the segment's rotated ID and a data signal.

24. Circuitry as claimed in claim 23, wherein each said segment has a local decoder connected for receiving said data signal and said rotation amount r and a segment ID assigned uniquely to the segment, and operable in each cycle to produce a rotated ID signal which is dependent on said assigned segment ID and which differs by said rotation amount r from the rotated ID signal in the preceding cycle, and to generate said digital signal for its segment in dependence upon a comparison of the rotated ID signal and said data signal.

25. Circuitry as claimed in claim 24, having first and second circuit portions, said first circuit portion being operable, for one or more segments, to produce a first part of the rotated ID signal and to compare that part of the rotated ID signal with a first part of said data signal, and said second circuit portion being operable, for said one or more segments, to produce a second part of said rotated ID signal and to compare that part with a second part of said data signal, and wherein said second circuit portion produces the second part of the rotated ID signal whilst said first circuit portion compares the first part of the rotated ID signal with the first part of the data signal.

26. Circuitry as claimed in claim 25, wherein one such first circuit portion is provided in common for a group of said segments whose respective said rotated-ID-signal first parts are the same and whose respective data-signal first parts are the same.

27. Digital-to-analog conversion circuitry comprising digital circuitry and analog circuitry, and operative to perform a series of operation cycles, wherein:
- said analog circuitry has a plurality of circuitry segments which together produce an output signal having a frequency in a predetermined desired range of frequencies; and
- the digital circuitry comprises:
  - digital signal generating circuitry operable in each said cycle to generate a set of digital signals for application to respective ones of said segments;
  - rotating circuitry operable to rotate by r segments the digital signals applied to the segments in each cycle as compared to those applied in the preceding cycle, where r is a rotation amount for the cycle concerned; and
  - rotation control circuitry which sets said rotation amount r for each said cycle such that one or more rotation components, being frequency components present in a frequency spectrum of said output signal as a result of said rotation, are mapped to one or more preselected frequencies or preselected narrow bands of frequencies outside said predetermined desired range.

28. Digital-to-analog conversion circuitry as claimed in claim 27, wherein each said segment comprises a current source or current sink circuit, and said output signal is derived by summing the respective currents sourced, or sunk as the case may be, by the current source/sink circuits of selected ones of said segments, the selection of the segments in each said cycle being made in accordance with said set of digital signals applied to the segments in that cycle.

29. A noise shaping method, for use in mixed-signal circuitry that comprises digital circuitry and analog circuitry and is operative to perform a series of operation cycles, the analog circuitry having a plurality of circuitry segments which together produce an output signal having a frequency in a predetermined desired range of frequencies, which method comprises:
- generating in each said cycle a set of digital signals for application to respective ones of said segments;
- rotating by r segments the digital signals applied to the segments in each cycle as compared to those applied in the preceding cycle, where r is a rotation amount for the cycle concerned; and
- setting said rotation amount for each said cycle such that one or more rotation components, being frequency components present in a frequency spectrum of said output signal as a result of said rotation, are mapped to one or more preselected frequencies or preselected narrow bands of frequencies outside said predetermined desired range.

30. A method of selecting a rotation amount r to be used by mixed-signal circuitry that is operative to perform a series of operation cycles and that comprises: analog circuitry having a plurality of circuitry segments which together produce an output signal having a frequency in a predetermined desired range of frequencies; and digital circuitry which in is each said cycle generates a set of digital signals for application to respective ones of said segments, the digital signals applied to the segments in each cycle being rotated by r segments as compared to those applied in the preceding cycle, such that one or more rotation components, being frequency components present in a frequency spectrum of said output signal as a result of said rotation, are mapped to one or more preselected frequencies or preselected narrow bands of frequencies outside said predetermined desired range;

said method comprising:

plotting a graph having a first axis representing frequency and a second axis, perpendicular to said first axis, representing said rotation amount r;

for each of a plurality of preselected lower-order rotation components, representing using a corresponding first line in the graph the different frequencies to which that component is mapped as said rotation amount r is varied;

representing one or more frequencies in said desired range of frequencies of the output signal using one or more corresponding second lines in the graph extending in the second-axis-direction at appropriate positions along the first axis;

identifying regions in said graph containing portions of said second lines that are not intersected by any of said first lines; and selecting said rotation amount r to be used by said mixed-signal circuitry from amongst the range of rotation amounts r corresponding to such an identified region.

31. A method as claimed in claim 30, further comprising the step of displaying the or each said graph on a display screen, or printing it on a recording medium, for analysis by an operator.

32. A method of selecting a rotation amount r to be used by mixed-signal circuitry that is operative to perform a series of operation cycles and that comprises: analog circuitry having a plurality of circuitry segments which together produce an output signal having a frequency in a predetermined desired range of frequencies; and digital circuitry which in each said cycle generates a set of digital signals for application to respective ones of said segments, the digital signals applied to the segments in each cycle being rotated by r segments as compared to those applied in the preceding cycle, such that one or more rotation components, being frequency components present in a frequency spectrum of said output signal as a result of said rotation, are mapped to one or more preselected frequencies or preselected narrow bands of frequencies outside said predetermined desired range;

said method comprising:

plotting a graph having a first axis representing frequency and a second axis, perpendicular to said first axis, representing said rotation amount r;

for each of a plurality of preselected significant intermodulation sidebands, representing using a corresponding first set of lines in said graph the different frequencies to which that sideband is mapped as said rotation amount is varied;

representing one or more frequencies in said desired range of frequencies of the output signal using one or more corresponding second lines in said graph extending in the second-axis-direction at appropriate positions along said first axis;

identifying regions in said graph containing portions of said second lines that are not intersected by any first-set lines; and selecting said rotation amount to be used by said mixed-signal circuitry from amongst the range of rotation amounts r corresponding to such an identified region.

33. A method as claimed in claim 32, further comprising the step of displaying the or each said graph on a display screen, or printing it on a recording medium, for analysis by an operator.

34. A method of selecting a rotation amount r to be used by mixed-signal circuitry that is operative to perform a series of operation cycles and that comprises: analog circuitry having a plurality of circuitry segments which together produce an output signal having a frequency in a predetermined desired range of frequencies; and digital circuitry which in each said cycle generates a set of digital signals for application to respective ones of said segments, the digital signals applied to the segments in each cycle being rotated by r segments as compared to those applied in the preceding cycle, such that one or more rotation components, being frequency components present in a frequency spectrum of said output signal as a. result of said rotation, are mapped to one or more preselected frequencies or preselected narrow bands of frequencies outside said predetermined desired range;

said method comprising:

plotting a first graph having a first axis representing frequency and a second axis, perpendicular to said first axis, representing said rotation amount r;

for each of a plurality of preselected lower-order rotation components, representing using a corresponding first line in said first graph the different frequencies to which that component is mapped as said rotation amount r is varied;

representing one or more frequencies in said desired range of frequencies of the output signal using one or more corresponding second lines in said first graph extending in the second-axis-direction thereof at appropriate positions along said first axis thereof;

identifying regions in said first graph containing portions of said second lines that are not intersected by any of said first lines;

plotting a second graph having a first axis representing frequency and a second axis, perpendicular to said first axis, representing said rotation amount r;

for each of a plurality of preselected significant intermodulation sidebands, representing using a corresponding first set of lines in said second graph the different frequencies to which that sideband is mapped as said rotation amount r is varied;

representing one or more frequencies in said desired range of frequencies of the output signal using one or more corresponding second lines extending in said second graph in the second-axis-direction thereof at appropriate positions along said first axis thereof;

identifying regions in said second graph containing portions of said second lines that are not intersected by any first-set lines; and selecting said rotation amount r to be used by said mixed-signal circuitry from amongst the range of rotation amounts r corresponding to such an identified region in one of said first and second graphs.

35. A method as claimed in claim 34, wherein in the selecting step said rotation amount r is selected so as to be included in both a first range of rotation amounts r, corresponding to such an identified region in said first graph, and in a second range of rotation amounts r corresponding to such an identified region in said second graph.

36. A method as claimed in claim 34, further comprising the step of displaying the or each said graph on a display screen, or printing it on a recording medium, for analysis by an operator.

37. A computer-readable recording medium storing a computer program for use in a method of selecting a rotation amount r to be used by mixed-signal circuitry that is operative to perform a series of operation cycles and that comprises: analog circuitry having a plurality of circuitry segments which together produce an output signal having a frequency in a predetermined desired range of frequencies; and digital circuitry which in each said cycle generates a set of digital signals for application to respective ones of said segments, the digital signals applied to the segments in each cycle being rotated by r segments as compared to those applied in the preceding cycle, such that one or more rotation components, being frequency components present in a frequency spectrum of said output signal as a result of said rotation, are mapped to one or more preselected frequencies or preselected narrow bands of frequencies outside said predetermined desired range;

said program comprising:
a plotting code portion which plots a graph having a first axis representing frequency and a second axis, perpendicular to said first axis, representing said rotation amount r;
a rotation component representing code portion which, for each of a plurality of preselected lower-order rotation components, represents using a corresponding first line in the graph the different frequencies to which that component is mapped as said rotation amount r is varied;
an output signal representing code portion which represents one or more frequencies in said desired range of frequencies of the output signal using one or more corresponding second lines in the graph extending in the second-axis-direction at appropriate positions along the firs[009f] axis;
thereby to facilitate identification of regions in said graph containing portions of said second lines that are not intersected by any of said first lines, and selection of said rotation amount r to be used by said mixed-signal circuitry from amongst the range of rotation amounts r corresponding to such an identified region.

38. A computer-readable recording medium storing a computer program for use in a method of selecting a rotation amount r to be used by mixed-signal circuitry that is operative to perform a series of operation cycles and that comprises: analog circuitry having a plurality of circuitry segments which together produce an output signal having a frequency in a predetermined desired range of frequencies; and digital circuitry which in each said cycle generates a set of digital signals for application to respective ones of said segments, the digital signals applied to the segments in each cycle being rotated by r segments as compared to those applied in the preceding cycle, such that one or more rotation components, being frequency components present in a frequency spectrum of said output signal as a result of said rotation, are mapped to one or more preselected frequencies or preselected narrow bands of frequencies outside said predetermined desired range;

said program comprising:
a plotting code portion which plots a graph having a first axis representing frequency and a second axis, perpendicular to said first axis, representing said rotation amount r;
an intermodulation sideband representing code portion which, for each of a plurality of preselected significant intermodulation sidebands, represents using a corresponding first set of lines in said graph the different frequencies to which that sideband is mapped as said rotation amount is varied;
an output signal representing code portion which represents one or more frequencies in said desired range of frequencies of the output signal using one or more corresponding second lines in said graph extending in the second-axis-direction at appropriate positions along said first axis;
thereby to facilitate identification of regions in said graph containing portions of said second lines that are not intersected by any first-set lines, and selection of said rotation amount to be used by said mixed-signal circuitry from amongst the range of rotation amounts r corresponding to such an identified region.

39. A computer-readable recording medium storing a computer program for use in a method of selecting a rotation amount r to be used by mixed-signal circuitry that is operative to perform a series of operation cycles and that comprises: analog circuitry having a plurality of circuitry segments which together produce an output signal having a frequency in a predetermined desired range of frequencies; and digital circuitry which in each said cycle generates a set of digital signals for application to respective ones of said segments, the digital signals applied to the segments in each cycle being rotated by r segments as compared to those applied in the preceding cycle, such that one or more rotation components, being frequency components present in a frequency spectrum of said output signal as a result of said rotation, are mapped to one or more preselected frequencies or preselected narrow bands of frequencies outside said predetermined desired range;

said program comprising:
a first plotting code portion which plots a first graph having a first axis representing frequency and a second axis, perpendicular to said first axis, representing said rotation amount r;
a rotation component representing portion which, for each of a plurality of preselected lower-order rotation components, represents using a corresponding first line in said first graph the different frequencies to which that component is mapped as said rotation amount r is varied;
a first output signal representing code portion which represents one or more frequencies in said desired range of frequencies of the output signal using one or more corresponding second lines in said first graph extending in the second-axis-direction thereof at appropriate positions along said first axis thereof;
a second plotting code portion which plots a second graph having a first axis representing frequency and a second axis, perpendicular to said first axis, representing said rotation amount r;
an intermodulation sideband representing code portion which, for each of a plurality of preselected significant intermodulation sidebands, represents using a corresponding first set of lines in said second graph the different frequencies to which that sideband is mapped as said rotation amount r is varied;
a second output signal representing code portion which represents one or more frequencies in said desired range of frequencies of the output signal using one or more corresponding second lines extending in said second graph in the second-axis-direction thereof at appropriate positions along said first axis thereof;
thereby to facilitate identification of regions in said first graph containing portions of said second lines that are not intersected by any of said first lines, identification of regions in said second graph containing portions of said second lines that are not intersected by any first-set lines, and selection of said rotation amount r to be used by said mixed-signal circuitry from amongst the range of rotation amounts r corresponding to such an identified region in one of said first and second graphs.

40. Digital signal generating circuitry, for generating a rotating set of digital signals in successive operation cycles in dependence upon a control signal, specifying a number of said digital signals in said set which are to have a predetermined state, and a rotation amount r, specifying a number of digital signals by which said set in a current one of said cycles is rotated relative to said set in the preceding cycle, said circuitry comprising:

a plurality of signal generating circuits, each having a circuit ID assigned uniquely to it, and each being operable in each said cycle to produce a rotated ID signal which is dependent on said assigned circuit ID and which differs by said rotation amount f from the rotated ID signal in the preceding cycle, and to set said digital signal for its signal generating circuit into said predetermined state in dependence upon a comparison of the rotated ID signal and said control signal;

each said signal generating circuit being provided with a first circuit portion operable to produce a first part of the rotated ID signal and to compare that part of the rotated ID signal with a first part of said control signal, and with a second circuit portion operable to produce a second part of said rotated ID signal and to compare that part with a second part of said control signal, wherein said second circuit portion produces the second part of the rotated ID signal whilst said first circuit portion compares the first part of the rotated ID signal with the first part of the control signal.

41. Circuitry as claimed in claim 40, wherein one such first circuit portion is provided in common for a group of said segments whose respective said rotated- ID-signal first parts are the same and whose respective data-signal first parts are the same.

42. Mixed-signal circuitry, comprising digital circuitry and analog circuitry, operative to perform a series of operation cycles, wherein:

said analog circuitry has a plurality of circuitry segments which together produce an output signal having a frequency in a predetermined desired range of frequencies; and the digital circuitry comprises:

digital signal generating means operable in each said cycle to generate a set of digital signals for application to respective ones of said segments;

rotating means operable to rotate by r segments the digital signals applied to the segments in each cycle as compared to those applied in the preceding cycle, where r is a rotation amount for the cycle concerned; and rotation control means for setting said rotation amount r for each said cycle such that one or more rotation components, being frequency components present in a frequency spectrum of said output signal as a result of said rotation, are mapped to one or more preselected frequencies or preselected narrow bands of frequencies outside said predetermined desired range.

* * * * *

UNITED STATES PATENT AND TRADEMARK OFFICE
CERTIFICATE OF CORRECTION

PATENT NO.    : 6,456,218 B1
DATED         : September 24, 2002
INVENTOR(S)   : Ian Juso Dedic et al.

It is certified that error appears in the above-identified patent and that said Letters Patent is hereby corrected as shown below:

<u>Title page,</u>
Item [30], change "9926650" to -- 9926650.4 --; change "0002049" to
-- 0002049.5 --; and add -- Oct. 26, 2000 Europe 00309413.3 --.

<u>Column 34,</u>
Line 17, delete ".".

Signed and Sealed this

Twenty-fifth Day of February, 2003

JAMES E. ROGAN
*Director of the United States Patent and Trademark Office*